US009203034B2

United States Patent
Kho et al.

(10) Patent No.: US 9,203,034 B2
(45) Date of Patent: Dec. 1, 2015

(54) ORGANIC LIGHT-EMITTING DIODE INCLUDING MULTI-LAYERED HOLE TRANSPORTING LAYER, AND FLAT DISPLAY DEVICE INCLUDING THE ORGANIC LIGHT-EMITTING DIODE

(75) Inventors: Sam-Il Kho, Yongin (KR); Mie-Hwa Park, Yongin (KR); Hyoung-Kun Kim, Yongin (KR); Yoon-Hyun Kwak, Yongin (KR); Ja-Hyun Lim, Yongin (KR); Chang-Woong Chu, Yongin (KR); Kwan-Hee Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 594 days.

(21) Appl. No.: 13/467,960

(22) Filed: May 9, 2012

(65) Prior Publication Data

US 2013/0153865 A1 Jun. 20, 2013

(30) Foreign Application Priority Data

Dec. 19, 2011 (KR) .......................... 10-2011-0137416

(51) Int. Cl.
*H01L 51/54* (2006.01)
*H01L 51/00* (2006.01)
*H01L 51/50* (2006.01)

(52) U.S. Cl.
CPC .......... *H01L 51/006* (2013.01); *H01L 51/0061* (2013.01); *H01L 51/0067* (2013.01); *H01L 51/0072* (2013.01); *H01L 51/5064* (2013.01)

(58) Field of Classification Search
CPC .............. H01L 51/006; H01L 51/0061; H01L 51/0067; H01L 51/0072; H01L 51/5064
See application file for complete search history.

(56) References Cited

U.S. PATENT DOCUMENTS

| 6,565,996 B2 | 5/2003 | Hatwar et al. |
| 9,006,721 B2 * | 4/2015 | Lee et al. .................. 257/40 |
| 2003/0048072 A1 | 3/2003 | Ishihara et al. |
| 2005/0106419 A1 | 5/2005 | Endoh et al. |

(Continued)

FOREIGN PATENT DOCUMENTS

| JP | 2005-166641 | 6/2005 |
| KR | 10-2005-0054427 | 6/2005 |

(Continued)

OTHER PUBLICATIONS

U.S. Office action dated Jan. 13, 2015, for cross reference U.S. Appl. No. 13/471,115, (9 pages).

(Continued)

*Primary Examiner* — Dawn L. Garrett
(74) *Attorney, Agent, or Firm* — Christie, Parker & Hale, LLP

(57) ABSTRACT

An organic light-emitting diode includes a first electrode; a second electrode facing the first electrode; an emission layer (EML) between the first electrode and the second electrode; a first charge generation layer between the EML and the first electrode and including a first compound and a first charge generation material; a first layer between the EML and the first charge generation layer and including a second compound; a second charge generation layer between the EML and the first layer and including a third compound and a second charge generation material; a second layer between the EML and the second charge generation layer and including a fourth compound; and a buffer layer between the EML and the second layer. The first and third compounds each independently includes a compound represented by Formula 1, and the second and fourth compounds each independently includes a compound represented by Formula 2.

20 Claims, 4 Drawing Sheets

(56) References Cited

U.S. PATENT DOCUMENTS

| | | |
|---|---|---|
| 2005/0121667 A1 | 6/2005 | Kuehl et al. |
| 2005/0221124 A1 | 10/2005 | Hwang et al. |
| 2006/0188745 A1 | 8/2006 | Liao et al. |
| 2006/0240277 A1 | 10/2006 | Hatwar et al. |
| 2007/0141396 A1 | 6/2007 | Chun et al. |
| 2008/0014464 A1 | 1/2008 | Kawamura et al. |
| 2009/0167161 A1 | 7/2009 | Yabunouchi et al. |
| 2009/0218933 A1 | 9/2009 | Matsushima et al. |
| 2010/0109000 A1 | 5/2010 | Mathai et al. |
| 2010/0219404 A1 | 9/2010 | Endo et al. |
| 2011/0084258 A1 | 4/2011 | Kim et al. |
| 2011/0193074 A1 | 8/2011 | Lee et al. |
| 2011/0233525 A1 | 9/2011 | Terao et al. |
| 2011/0248251 A1 | 10/2011 | Yamamoto et al. |
| 2013/0032788 A1 | 2/2013 | Lee et al. |
| 2013/0140530 A1 * | 6/2013 | Kho et al. ............ 257/40 |
| 2013/0153865 A1 | 6/2013 | Kho et al. |
| 2014/0246663 A1 | 9/2014 | Kambe et al. |

FOREIGN PATENT DOCUMENTS

| | | |
|---|---|---|
| KR | 10-2005-0097670 | 10/2005 |
| KR | 10-2007-0068147 | 6/2007 |
| KR | 10-2009-0098930 | 9/2009 |
| KR | 10-2010-0039815 | 4/2010 |
| KR | 10-2010-0043994 A | 4/2010 |
| KR | 10-2010-0068617 | 6/2010 |
| KR | 10-2010-0094819 | 8/2010 |
| KR | 10-2010-0095504 | 8/2010 |
| KR | 10-2010-0097180 | 9/2010 |
| KR | 10-2011-0039812 | 4/2011 |
| KR | 10-2011-0089142 | 8/2011 |
| WO | WO 2009/069434 A1 | 6/2009 |

OTHER PUBLICATIONS

U.S. Office action dated Feb. 25, 2015, for cross reference U.S. Appl. No. 13/543,714, (9 pages).

* cited by examiner

ORGANIC LIGHT-EMITTING DIODE INCLUDING MULTI-LAYERED HOLE TRANSPORTING LAYER, AND FLAT DISPLAY DEVICE INCLUDING THE ORGANIC LIGHT-EMITTING DIODE

CROSS-REFERENCE TO RELATED PATENT APPLICATION

This application claims priority to and the benefit of Korean Patent Application No. 10-2011-0137416, filed on Dec. 19, 2011 in the Korean Intellectual Property Office, the entire content of which is incorporated herein by reference.

BACKGROUND

1. Technical Field

Embodiment of the present invention relates to an organic light-emitting diode (OLED) including a multi-layered hole transporting layer and a flat display device including the organic light-emitting diode. More particularly, embodiments of the present invention relate to an OLED including a hole transporting layer that includes a plurality of layers formed using a hole transporting material and a charge generation material which have different energy levels from each other, and to a flat display device including the OLED.

2. Description of the Related Art

Organic light emitting diodes (OLEDs) are self-emission devices that have wide viewing angles, high contrast ratios, short response times, and excellent brightness, driving voltage, and response speed characteristics. OLEDs also enable generation of multi-color images.

In a typical organic light-emitting diode, an anode is formed on a substrate, and a hole transport layer, emission layer, electron transport layer, and cathode are sequentially formed (in this order) on the anode. In this regard, the hole transport layer, the emission layer, and the electron transport layer are organic films including organic compounds. When a voltage is applied between the anode and the cathode, holes injected from the anode pass through the hole transport layer and migrate toward the emission layer, and electrons injected from the cathode pass through the electron transport layer and migrate toward the emission layer. The holes and electrons, which are carriers, are recombined in the emission layer to generate excitons, and then the excitons change from an excited state to a ground state, thereby generating light.

The hole transport material used in the hole transporting layer has, in general, good hole injection function or hole transport function, and thus a formed device has low driving voltage. That is, if a hole transport material having high hole mobility is used in the hole transporting layer, the driving voltage of the formed device is substantially decreased. However, charges are excessively injected, and thus a formed device may have low efficiency and a short lifetime. To resolve these problems, many efforts have been made.

For example, in an organic light-emitting diode including an anode and a cathode formed on a substrate, some research has been conducted into providing the organic light-emitting diode with a first hole transporting layer (P-HTL) doped with a P-type dopant and a second hole transporting layer (HTL) (which are sequentially formed in this order); at least one emission layer (EML) formed on the second HTL; and a first electron transporting layer (ETL) and a second ETL (N-ETL) doped with an N-type dopant (which are sequentially formed on the EML in this order), where the EML has a quantum-well structure. This organic light-emitting diode is a PIN-structure phosphorescent organic light-emitting diode, and the organic layers included in the organic light-emitting diode include organic thin films doped with P-type and N-type dopants, and the emission layer is formed as a quantum-well structure to reduce an energy barrier to trap recombined excitons therein, thereby improving luminescent characteristics. However, in a phosphorescent organic light-emitting diode having a PIN structure, the thermal stability of an organic material is relatively reduced, and thus the organic light-emitting diode has a reduced lifetime. Also, because (unlike a typical inorganic semiconductor) the phosphorescent organic light-emitting diode having the PIN structure does not have crystallinity, it is difficult to reproduce current control.

Additionally, research has been conducted into providing an organic EL device including a cathode, an anode, and a HIL, a HTL, an EML, an ETL, an EIL between the cathode and the anode, where the HIL is formed by doping an electron accepting impurity on a hole injection layer material, and the ionization potential (Ip(HIL)) of the hole injection layer material of the hole injection layer, the ionization potential (Ip(HTL)) of the hole transporting layer material, and the ionization potential(Ip(EML)) of the emission layer material comply with the relationship: $Ip(EML) > Ip(HTL) \geq Ip(HIL) \geq Ip(EML) - 0.4$ eV. In the HIL included in the organic EL device, an electron accepting dopant (p-type doping) is added to, for example, a material having a triarylamine moiety structure, a carbazole moiety structure, and an oxadiazole moiety structure, and thus the hole injection properties with respect to the EML are improved, and luminescent efficiency of the organic EL device is maintained or improved, thereby decreasing the driving voltage. However, owing to the inclusion of the HIL doped with the p-type dopant and thus injection of excess holes, the organic EL device has reduced lifetime and efficiency.

Further research has been conducted into an organic EL device including a cathode layer; an anode layer facing the cathode layer; and an EML including an organic compound between the cathode layer and the anode layer, where when holes are injected through the cathode layer and electrons are injected through the anode layer, an excitation state occurs in the organic compound of the EML and thus light is generated. Also, in this organic EL device, an electron accepting material is positioned between the cathode layer and the anode layer, is provided to at least one HTL that transports the holes injected through the cathode layer, and is located in a portion that is not adjacent to the cathode layer. This organic EL device includes two or more layered HTLs located adjacent to the cathode layer, a hole transport molecule that constitutes the HTL, an electron accepting material layer, and an electron accepting material that constitutes the electron accepting material layer. In detail, the organic EL device may have a substrate/cathode layer/first hole transport layer/mixed layer including a first hole transport molecule and an electron accepting material/mixed layer including a second hole transport molecule and an electron accepting material/second hole transport layer/emission layer structure. However, in an organic EL device having a first hole transport layer/p-doped first hole transport layer/p-doped second hole transport layer/second hole transport layer structure, it is difficult to control the balance of charges formed in the EML.

SUMMARY

Embodiments of the present invention provide an organic light-emitting diode (OLED) having high luminous efficiency and a long lifetime by including a multi-layered hole transport layer including a first charge generation layer, a first layer, a second charge generation layer, and a second layer in order to balance the injection and flow of holes and electrons.

According to an aspect of the present invention, an organic light-emitting diode (OLED) includes a first electrode; a second electrode facing the first electrode; an emission layer (EML) between the first electrode and the second electrode; a first charge generation layer between the EML and the first electrode that includes a first compound and a first charge generation material; a first layer between the EML and the first charge generation layer that includes a second compound; a second charge generation layer between the EML and the first layer that includes a third compound and a second charge generation material; a second layer between the EML and the second charge generation layer that includes a fourth compound; and a buffer layer between the EML and the second layer, where the first compound and the third compound each independently include a compound represented by Formula 1 below, and the second compound and the fourth compound each independently include a compound represented by Formula 2 below:

Formula 1

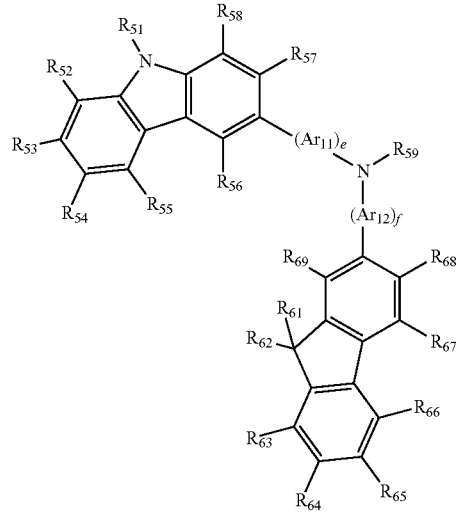

In Formula 1, $Ar_{11}$ and $Ar_{12}$ may each independently be a substituted or unsubstituted $C_5$-$C_{60}$ arylene group; e and f may each independently be an integer of 0 to 5; $R_{51}$ through $R_{58}$ and $R_{61}$ through $R_{69}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, and a substituted or unsubstituted $C_5$-$C_{60}$ arylthio group; and $R_{59}$ may be one of a phenyl group, a naphthyl group, an anthryl group, a biphenyl group, and a pyridyl group. Alternatively, $R_{59}$ may be one of a phenyl group, a naphthyl group, an anthryl group, a biphenyl group, and a pyridyl group of which at least one hydrogen atom is substituted with at least one of a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

Formula 2

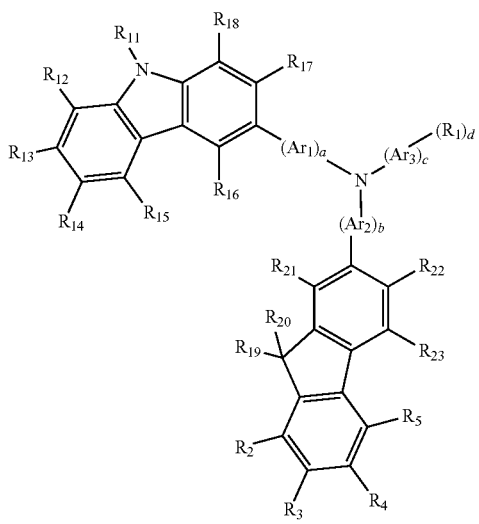

In Formula 2, $Ar_1$ through $Ar_3$ may each independently be a substituted or unsubstituted $C_5$-$C_{60}$ arylene group; a and b may each independently be an integer of 0 to 5; c may be an integer of 1 to 5; $R_1$ through $R_5$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{31}$)($R_{32}$)($R_{33}$), —N($R_{34}$)($R_{35}$), and a nitrogen atom-containing group, where at least one of $R_1$ through $R_5$ may be a nitrogen atom-containing group; d may be an integer of 0 to 5; $R_{11}$ through $R_{23}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{36}$)($R_{37}$)($R_{38}$), and —N($R_{39}$)($R_{40}$); $R_{31}$ through $R_{40}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, and a substituted or unsubstituted $C_2$-$C_{60}$ heteroaryl group. The term "nitrogen atom-containing group," as used herein, refers to a 5-membered aromatic ring, a 6-membered aromatic ring, or a 9-membered aromatic ring in which a 5-membered aromatic group and a 6-membered aromatic group are fused.

The highest occupied molecular orbital (HOMO) energy level of the second compound may be about 0.1 eV to about 0.2 eV lower than the HOMO energy level of the first compound, and the lowest unoccupied molecular orbital (LUMO) energy level of the second compound may be about 0.1 eV to about 0.2 eV lower than the LUMO energy level of the first compound.

A hole mobility of the first compound may be higher than a hole mobility of the second compound.

In some embodiments, the first compound and the third compound may each independently include a compound represented by Formula 1A below:

Formula 1A

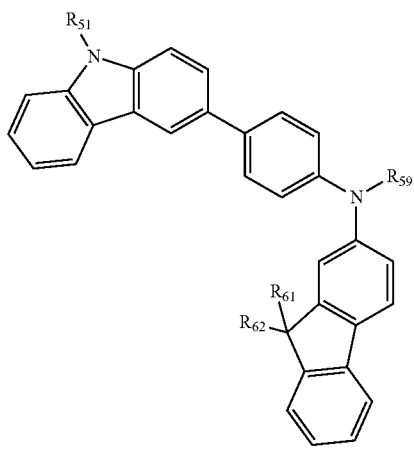

In Formula 1A, $R_{51}$, $R_{59}$, $R_{61}$ and $R_{62}$ are as defined above with respect to Formula 1.

In some embodiments, the first compound and the third compound may each independently include Compound 301 below:

Compound 301

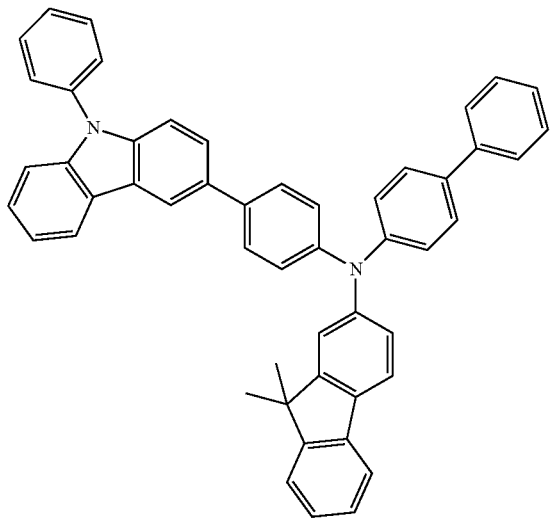

In some embodiments, the second compound and the fourth compound may each independently include at least one compound represented by Formulae 2A through 2K below:

Formula 2A

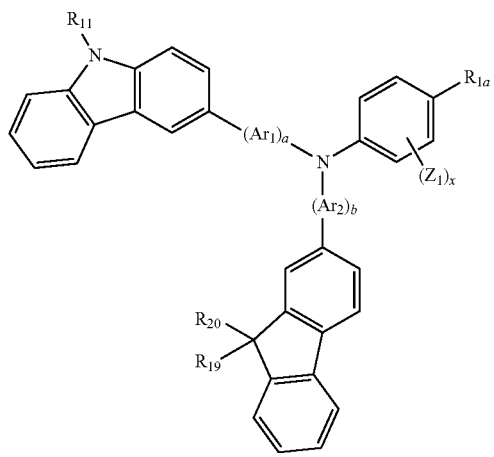

Formula 2B

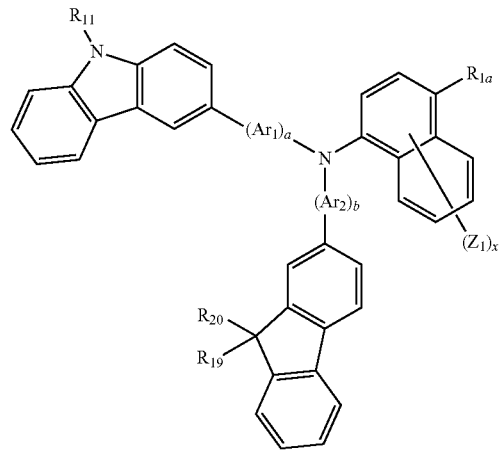

Formula 2C
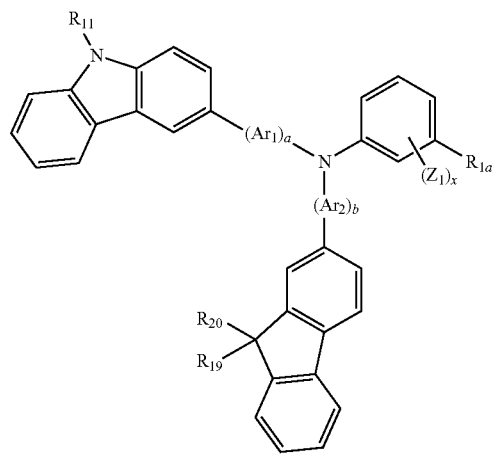
Formula 2F
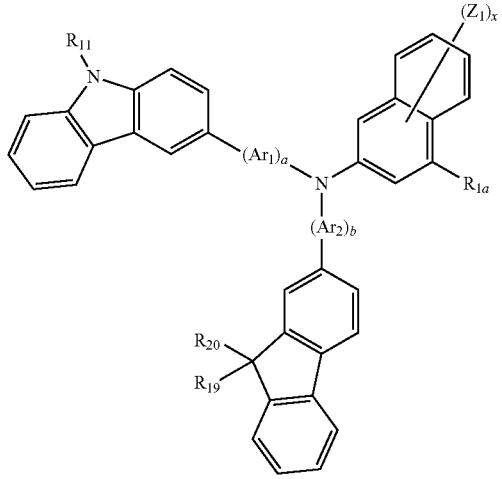
Formula 2D
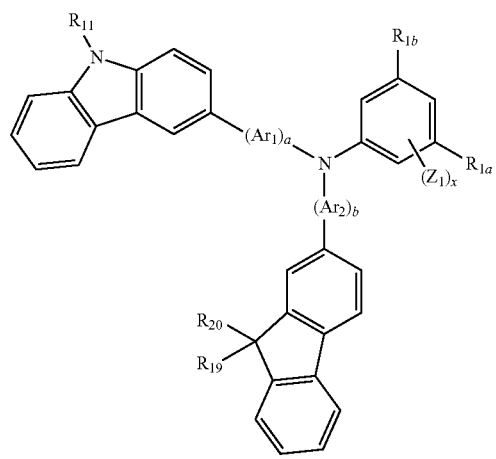
Formula 2G
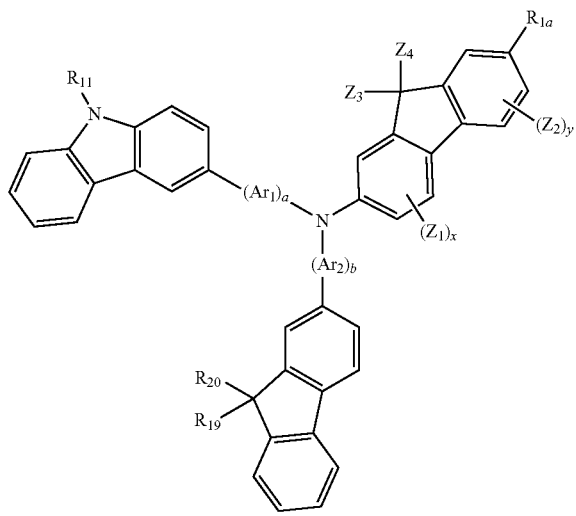
Formula 2E
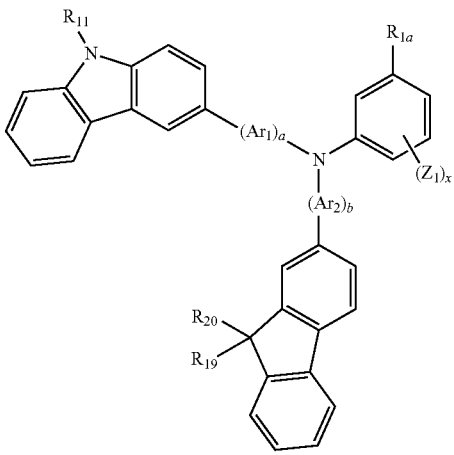
Formula 2H
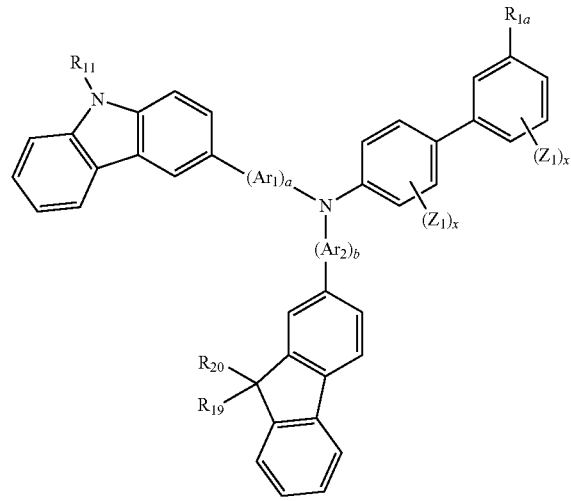

Formula 2I

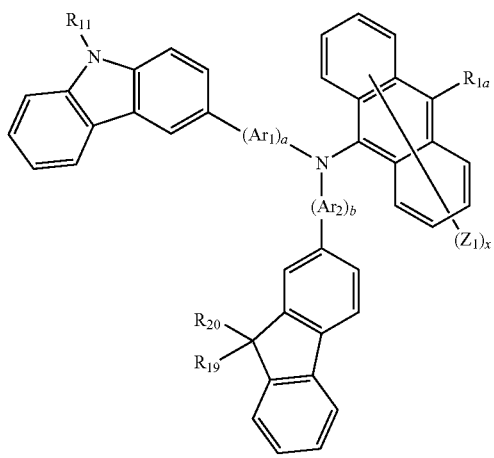

Formula 2J

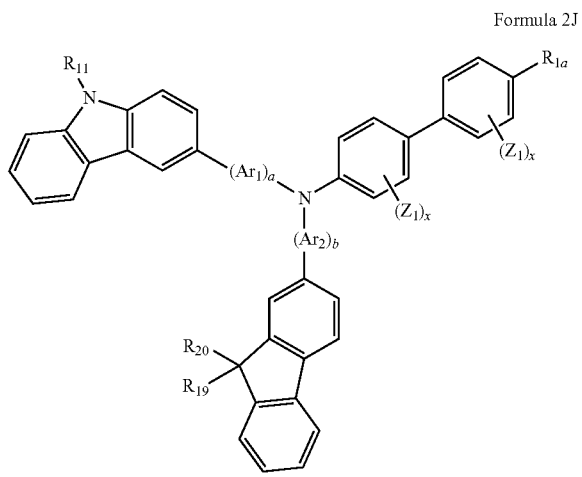

Formula 2K

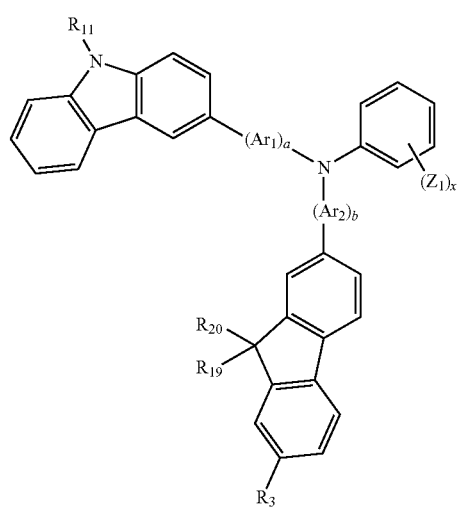

In Formulae 2A through 2K, $Ar_1$ and $Ar_2$ may each independently be a substituted or unsubstituted $C_5$-$C_{60}$ arylene group; a and b may each independently be an integer of 0 to 5; $R_{1a}$, $R_{1b}$ and $R_3$ may each independently be a nitrogen atom-containing group; $R_{11}$, $R_{19}$ and $R_{20}$ may each independently be one of a substituted or unsubstituted $C_1$-$C_{60}$ alkyl group and a substituted or unsubstituted $C_5$-$C_{60}$ aryl group; $Z_1$ through $Z_4$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($Q_1$)($Q_2$)($Q_3$) and —N($Q_4$)($Q_5$), where when x or y is 2 or greater, a plurality of $Z_1$ or $Z_2$ may be identical to or different from each other; $Q_1$ through $Q_5$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, and a substituted or unsubstituted $C_2$-$C_{60}$ heteroaryl group; x may be an integer of 1 to 8; and y may be an integer of 1 to 3.

In some embodiments, the first charge generation material and the second charge generation material may each independently include at least one of Compounds 501 and 502 below:

Compound 501

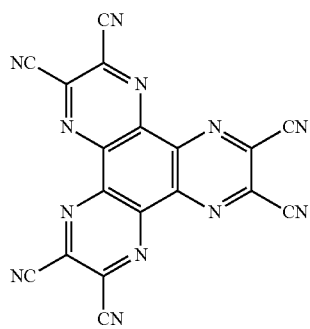

Compound 502

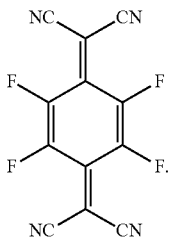

In some embodiments, the first compound and the third compound may be the same compound.

In some embodiments, the second compound and the fourth compound may be the same compound.

In some embodiments, the thicknesses of the first layer and the second layer may each independently be in a range of about 40 nm to about 60 nm.

In some embodiments, a concentration of the first charge generation material may be in a range of about 1 to about 3 parts by weight based on 100 parts by weight of the first charge generation layer.

In some embodiments, a concentration of the second charge generation material may be in a range of about 1 to about 3 parts by weight based on 100 parts by weight of the second charge generation layer.

In some embodiments, the thicknesses of the first charge generation layer and the second charge generation layer may each independently be in a range of about 10 nm to about 20 nm.

In some embodiments, the buffer layer may include the compound represented by Formula 1.

In some embodiments, a thickness of the buffer layer may be in a range of about 0.1 nm to about 30 nm.

In some embodiments, the first layer and the first charge generation layer may be in contact with each other.

In some embodiments, the second layer and the second charge generation layer may be in contact with each other.

In some embodiments, the OLED may include at least one of a hole blocking layer, an electron transport layer, an electron injection layer, and a functional layer having electron transport and electron injection ability between the EML and the second electrode.

According to another aspect of the present invention, a flat display device includes a transistor including a source, a drain, a gate, and an active layer; and the OLED, where the first electrode of the OLED may be electrically connected to the source or the drain.

BRIEF DESCRIPTION OF THE DRAWINGS

The above and other features and advantages of the present invention will become more apparent by reference to the following detailed description when considered in conjunction with the attached drawings in which.

DETAILED DESCRIPTION OF THE INVENTION

As used herein, the term "and/or" includes any and all combinations of one or more of the associated listed items. Expressions such as "at least one of," when preceding a list of elements, modify the entire list of elements and do not modify the individual elements of the list.

Figure 1:
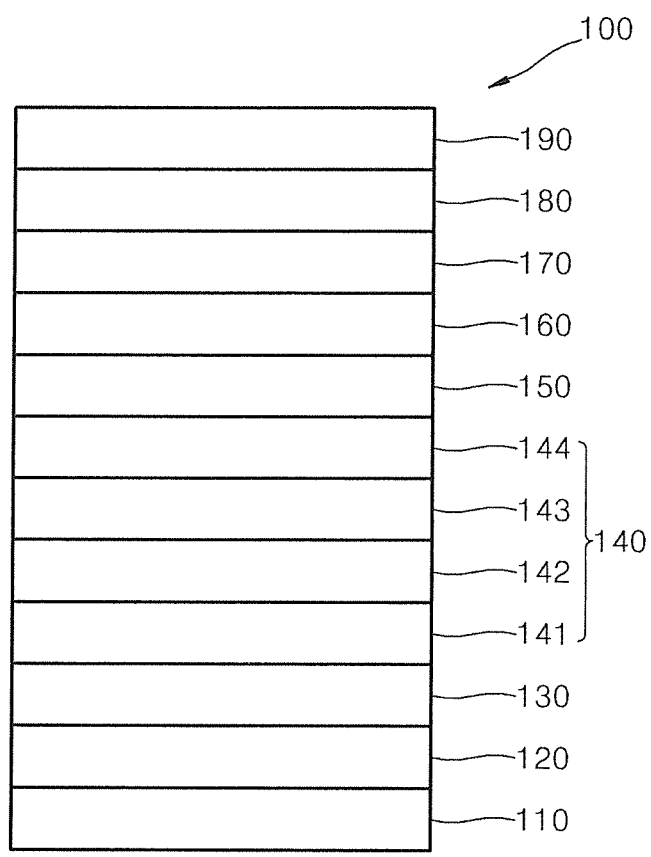
FIG. 1 is a schematic cross-sectional view of an organic light-emitting diode (OLED) according to an embodiment.

FIG. 1 is a schematic cross-sectional view of a structure of an organic light-emitting diode (OLED) 100 according to an embodiment.

Referring to FIG. 1, the OLED 100 includes a first electrode 120; a second electrode 190 opposite to the first electrode 120; an emission layer (EML) 160 disposed between the first electrode 120 and the second electrode 190; a first charge generation layer 141 disposed between the EML 160 and the first electrode 120 and including a first compound and a first charge generation material; a first layer 142 disposed between the EML 160 and the first charge generation layer 141 and including a second compound; a second charge generation layer 143 disposed between the EML 160 and the first layer 142 and including a third compound and a second charge generation material; a second layer 144 disposed between the EML 160 and the second charge generation layer 143 and including a fourth compound; and a buffer layer 150 disposed between the EML 160 and the second layer 144.

For example, the OLED 100 may have a structure that includes a substrate 110, the first electrode 120, a hole injection layer (HIL) 130, the first charge generation layer 141, the first layer 142, the second charge generation layer 143, the second layer 144, the buffer layer 150, the EML 160, an electron transport layer (ETL) 170, an electron injection layer (EIL) 180 and the second electrode 190 (in sequential order).

The first compound and the third compound may each independently include a compound represented by Formula 1 below:

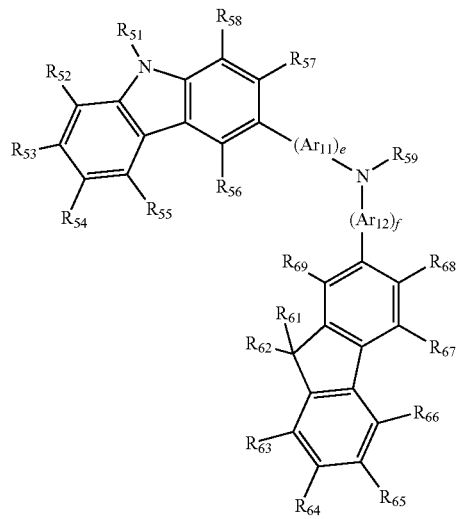

Formula 1

In Formula 1, $Ar_{11}$ and $Ar_{12}$ may each independently be a substituted or unsubstituted $C_5$-$C_{60}$ arylene group.

For example, $Ar_{11}$ through $Ar_{12}$ may each independently be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, or a substituted or unsubstituted hexacenylene group.

In Formula 1, e and f may each independently be an integer of 0 to 5.

When e and/or f is 0, a carbazole ring of Formula 1 and/or a fluorine ring of Formula 1 may be directly bound to a nitrogen in the middle of Formula 1. For example, e and f may be 0, 1, or 2, but are not limited thereto. When e is 2 or greater, two or more of $Ar_{11}$ may be identical to or different from each other. Also, when f is 2 or greater, two or more of $Ar_{12}$ may be identical to or different from each other.

In Formula 1, $R_{51}$ through $R_{58}$ and $R_{61}$ through $R_{69}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, and a substituted or unsubstituted $C_5$-$C_{60}$ arylthio group.

In Formula 1, $R_{59}$ may be one of a phenyl group, a naphthyl group, an anthryl group, a biphenyl group, and a pyridyl group. Alternatively, $R_{59}$ may be one of a phenyl group, a naphthyl group, an anthryl group, a biphenyl group, and a pyridyl group in which at least one hydrogen atom is substituted with at least one of a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group.

In some embodiments, the first compound and the third compound may each independently include a compound represented by Formula 1A below:

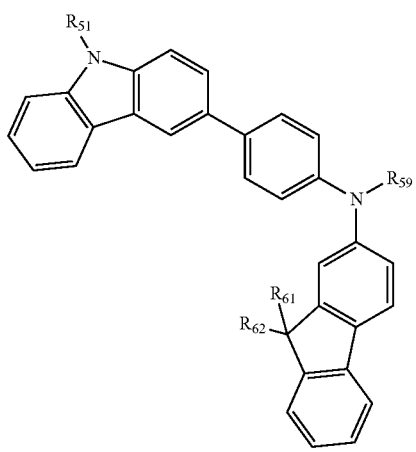

Formula 1A

In Formula 1A, $R_{51}$, $R_{59}$, $R_{61}$ and $R_{62}$ are as defined above with respect to Formula 1.

For example, the first compound and the third compound may include Compound 301 below, but are not limited thereto.

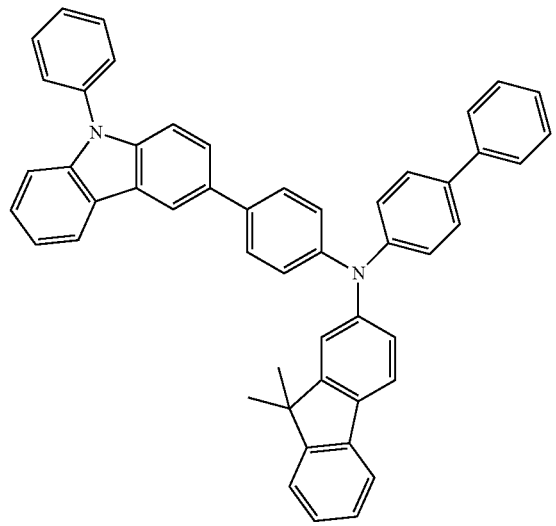

Compound 301

In some embodiments, the second compound and the fourth compound may each independently include a compound represented by Formula 2 below:

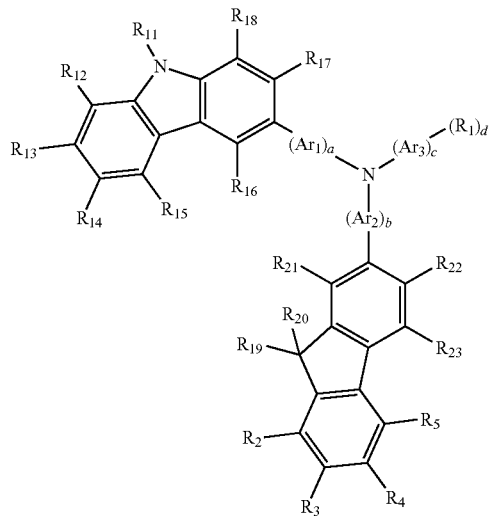

Formula 2

In Formula 2, $Ar_1$ through $Ar_3$ may each independently be a substituted or unsubstituted $C_5$-$C_{60}$ arylene group.

For example, $Ar_1$ through $Ar_3$ may each independently be a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenalenylene group, a substituted or unsubstituted phenanthrenylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentacenylene group, or a substituted or unsubstituted hexacenylene group.

In Formula 2, a and b may each independently be an integer of 0 to 5. When a and/or b is 0, a carbazole ring of Formula 1 and/or a fluorine ring of Formula 1 may be directly bound to a nitrogen in the middle of Formula 1. For example, the a and b may be 0, 1, or 2, but are not limited thereto. When a is 2 or greater, two or more of $Ar_1$ may be identical to or different from each other. Also, when b is 2 or greater, two or more of $Ar_2$ may be identical to or different from each other.

In Formula 2, c may be an integer of 1 to 5. Since c may be an integer of 1 to 5, $Ar_3$ is necessarily present in Formula 1. For example, the c may be 1 or 2, but is not limited thereto. When c is 2 or greater, two or more of $Ar_3$ may be identical to or different from each other.

In Formula 2, $R_1$ through $R_5$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{31}$)($R_{32}$)($R_{33}$), —N($R_{34}$)($R_{35}$), and a nitrogen atom-containing group, where at least one of $R_1$ through $R_5$ is a nitrogen atom-containing group ($R_{31}$ through $R_{35}$ are described below).

For example, $R_1$ through $R_5$ may each independently be a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{10}$ alkyl group, a substituted or unsubstituted $C_1$-$C_{10}$ alkoxy group, a substituted or unsubstituted $C_5$-$C_{20}$ aryl group, or a nitrogen atom-containing group, where at least one of $R_1$ through $R_5$ may be a nitrogen atom-containing group.

Herein, a nitrogen atom-containing group refers to a 5-membered aromatic ring, a 6-membered aromatic ring, or a 9-membered aromatic ring in which a 5-membered aromatic group and a 6-membered aromatic group are fused. For example, a nitrogen atom-containing group may be represented by one of Formulae 4A through 4P below.

Formula 4A

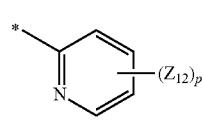

Formula 4B

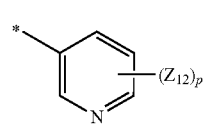

Formula 4C

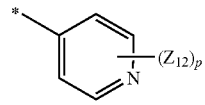

Formula 4D

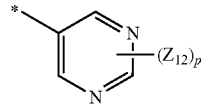

Formula 4E

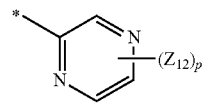

Formula 4F

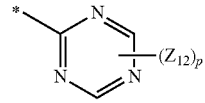

Formula 4G

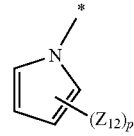

Formula 4H

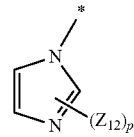

Formula 4I

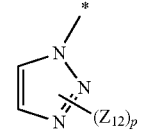

Formula 4J

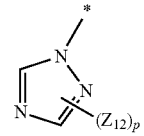

Formula 4K

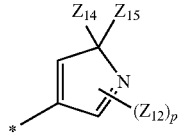

Formula 4L

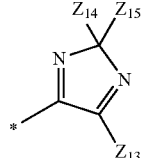

Formula 4M

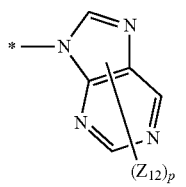

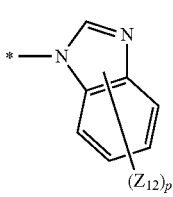

Formula 4N

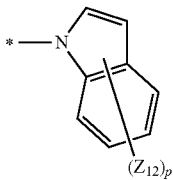

Formula 4O

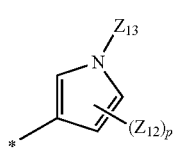

Formula 4P

In Formula 4A through 4P, $Z_{12}$, $Z_{13}$, $Z_{14}$ and $Z_{15}$ may each independently be a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a methyl group, an ethyl group, a propyl group, or a butyl group. For example, in Formula 4A through 4P, $Z_{12}$, $Z_{13}$, $Z_{14}$ and $Z_{15}$ may all be a hydrogen atom. In Formula 4A through 4P, p may be an integer of 1 to 6. Within this range, p may be appropriately selected according to the structure of Formulas 4A through 4P. When p is 2 or greater, two or more of $Z_{12}$ may be identical to or different from each other.

In Formula 2, d may be an integer of 0 to 5. For example, d may be 0, 1, or 2, but is not limited thereto. Within this range, d may be appropriately selected according to the structure of $Ar_3$. When d is 2 or greater, two or more of $R_1$ may be identical to or different from each other.

In Formula 2, $R_{11}$ through $R_{23}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{36}$) ($R_{37}$)($R_{38}$), and —N($R_{39}$)($R_{40}$).

For example, $R_{12}$ through $R_{18}$ and $R_{21}$ through $R_{23}$ may each independently be a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, or a phosphoric acid group or a salt thereof, and $R_{11}$, $R_{19}$ and $R_{20}$ may each independently be one of a hydrogen atom, a methyl group, an ethyl group, a propyl group, a butyl group, a pentyl group, a phenyl group, a naphthyl group, an anthryl group, a fluorenyl group and a pyrenyl group, but are not limited thereto.

In —Si($R_{31}$)($R_{32}$)($R_{33}$), —N($R_{34}$)($R_{35}$), —Si($R_{36}$)($R_{37}$) ($R_{38}$) and —N($R_{39}$)($R_{40}$), $R_{31}$ through $R_{40}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, and a substituted or unsubstituted $C_2$-$C_{60}$ heteroaryl group. For example, $R_{31}$ through $R_{40}$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a $C_1$-$C_{10}$ alkyl group (e.g., a methyl group, an ethyl group, a propyl group, a butyl group, a pentyl group, or a hexyl group), a $C_1$-$C_{10}$ alkoxy group (e.g., a methoxy group, an ethoxy group, a propoxy group, a butoxy group, or a pentoxy group), a phenyl group, a naphthyl group, an anthryl group, a fluorenyl group, a pyrenyl group. Alternatively, $R_{31}$ through $R_{40}$ may each independently be one of a $C_1$-$C_{10}$ alkyl group, a $C_1$-$C_{10}$ alkoxy group, a phenyl group, a naphthyl group, an anthryl group, a fluorenyl group, and a pyrenyl group in which one or more of the hydrogen atoms is substituted with one or more of a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a $C_1$-$C_{10}$ alkyl group, and a $C_1$-$C_{10}$ alkoxy group, but are not limited thereto.

In Formula 2, $R_1$ may be a nitrogen atom-containing group, and c and d may each independently be 1 or 2. In Formula 2, at least one of $R_2$ through $R_5$ may be a nitrogen atom-containing group.

According to an embodiment, the second compound and the fourth compound may each independently include at least one compound represented by Formulae 2A through 2K below:

Formula 2A

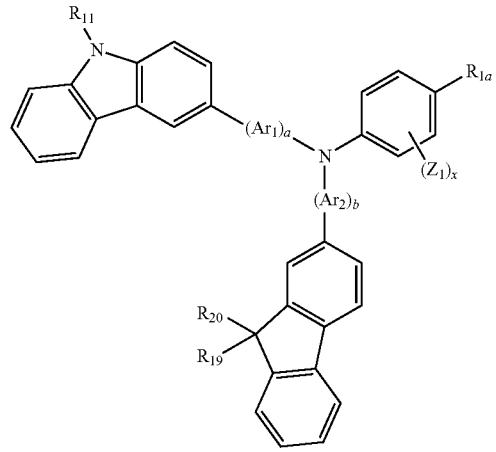

-continued
Formula 2B
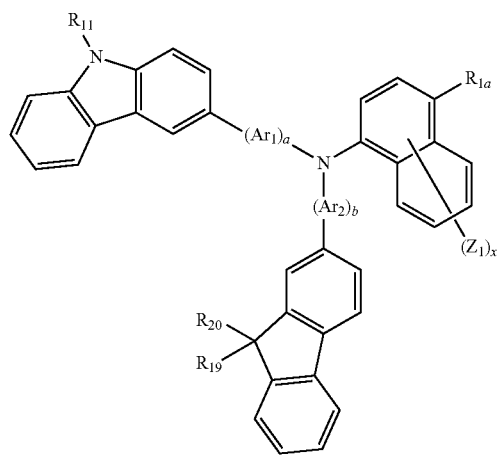
Formula 2C
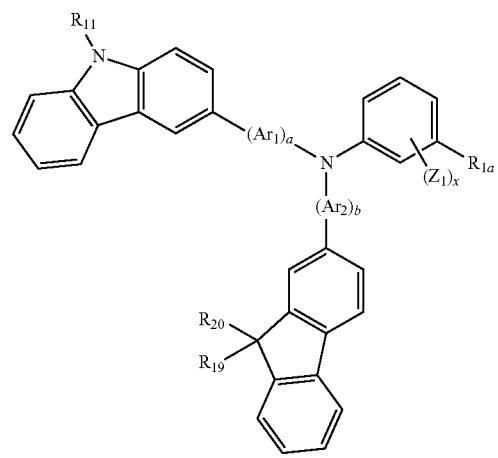
Formula 2D
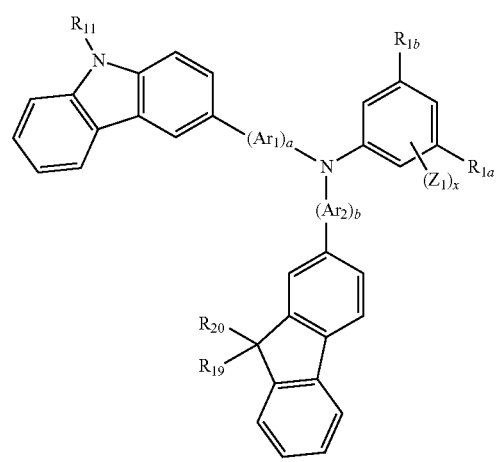
Formula 2E
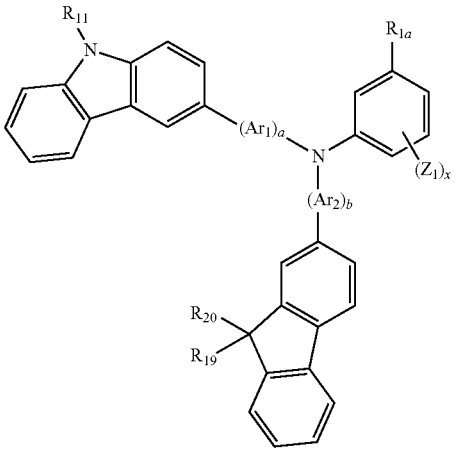
Formula 2F
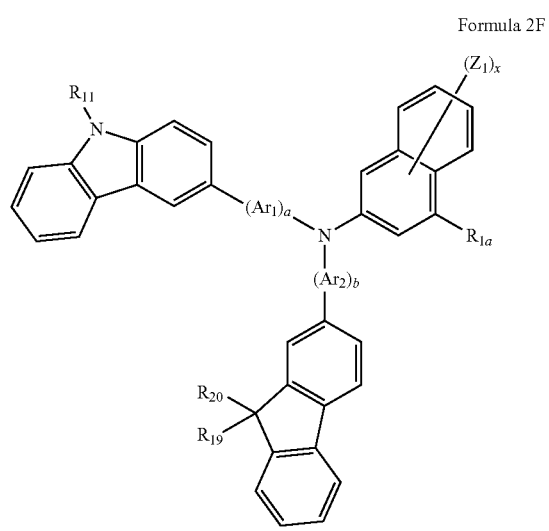
Formula 2G
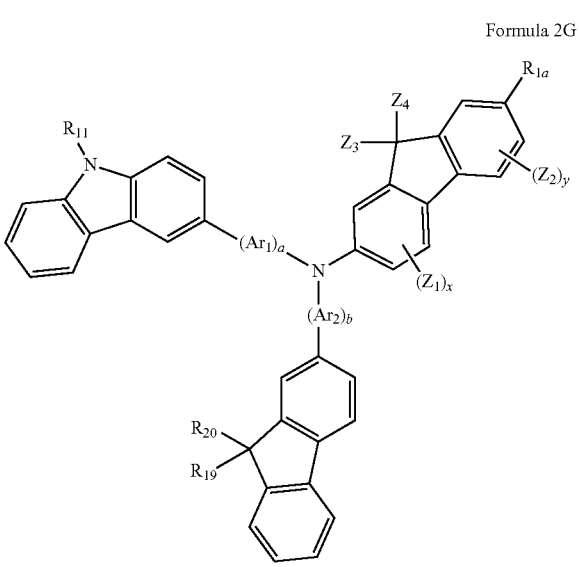

Formula 2H

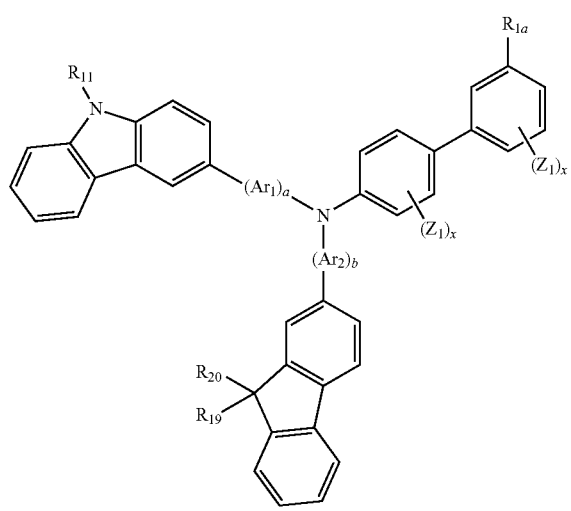

Formula 2I

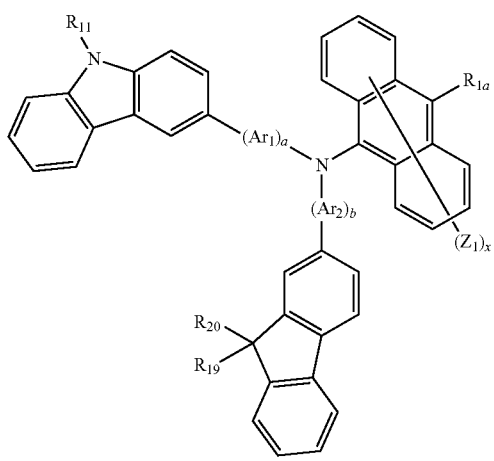

Formula 2J

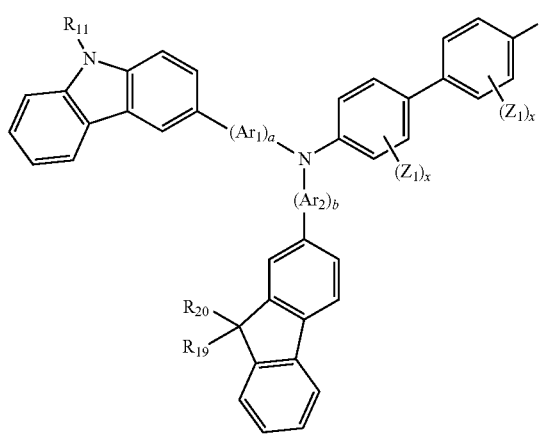

Formula 2K

In Formulae 2A through 2K, $Ar_1$ and $Ar_2$ may each independently be a substituted or unsubstituted $C_5$-$C_{60}$ arylene group; a and b may each independently be an integer of 0 to 5; $R_{1a}$, $R_{1b}$ and $R_3$ may each independently be a nitrogen atom-containing group; and $R_{11}$, $R_{19}$ and $R_{20}$ may each independently be one of a substituted or unsubstituted $C_1$-$C_{60}$ alkyl group and a substituted or unsubstituted $C_5$-$C_{60}$ aryl group. The nitrogen atom-containing group is as described above.

In Formulae 2A through 2K, $Z_1$ through $Z_4$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($Q_1$)($Q_2$)($Q_3$) and —N($Q_4$)($Q_5$), and when x or y is 2 or greater, the plurality of $Z_1$ or $Z_2$ may be identical to or different from each other. Also, x may be an integer of 1 to 8, and y may be an integer of 1 to 3.

Herein, $Q_1$ through $Q_5$ may each independently be one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, and a substituted or unsubstituted $C_2$-$C_{60}$ heteroaryl group.

The second compound and the fourth compound may each independently be one of Compounds 2, 8, 14, 15, 16, 20, 31 and 35 below, but are not limited thereto:

-continued
2
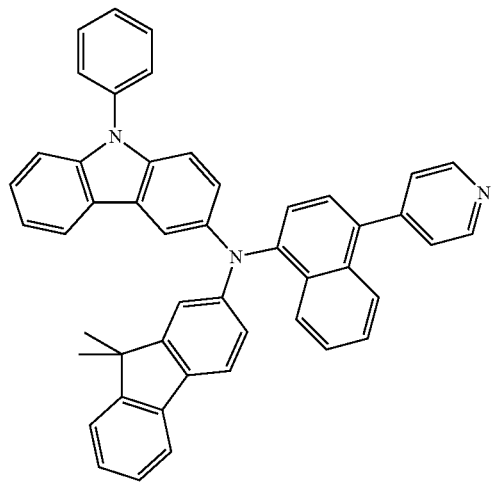
5
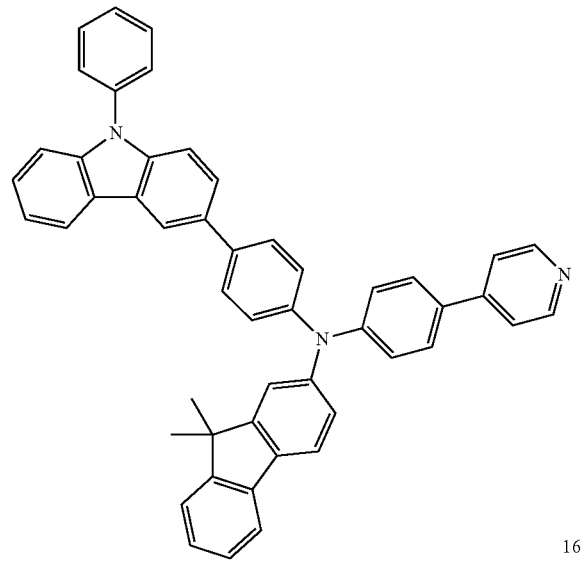
8
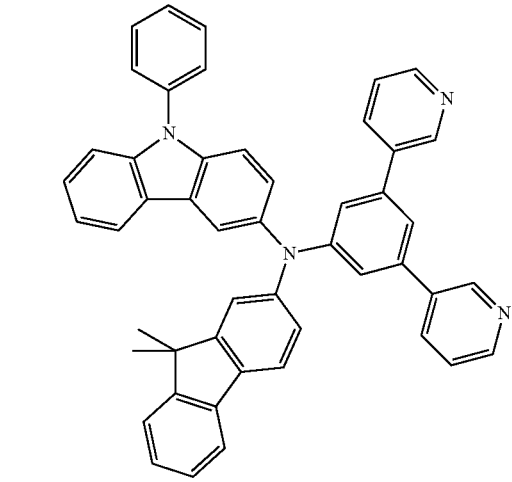
14
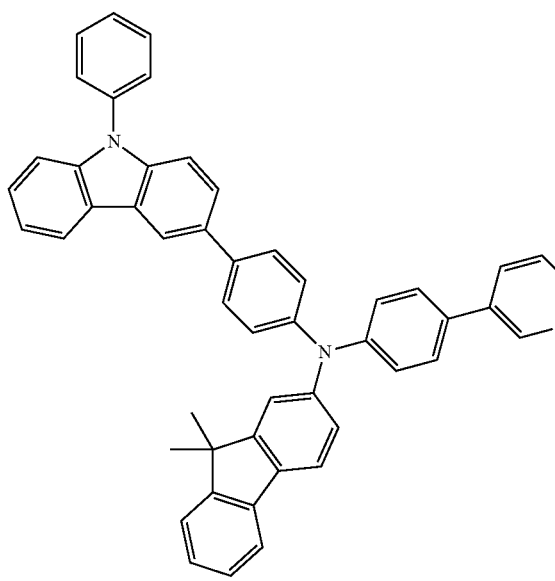
15
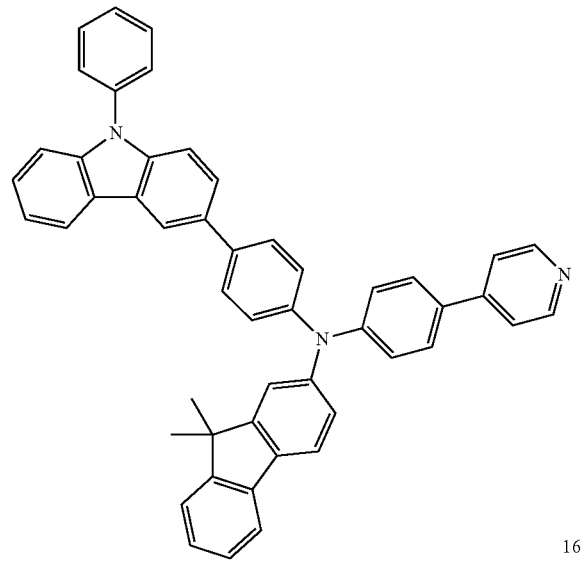
16
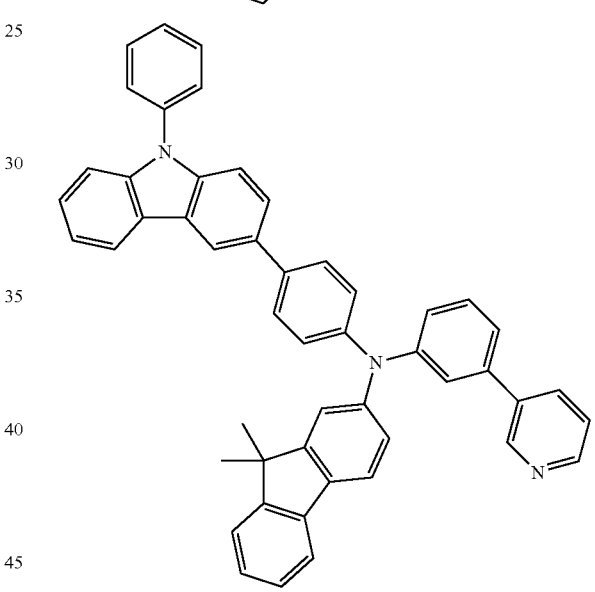
20
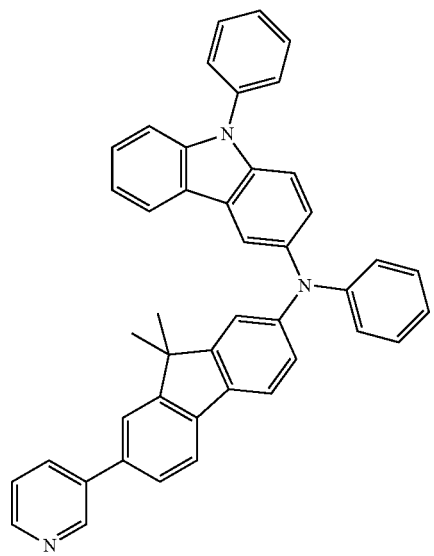

-continued

31

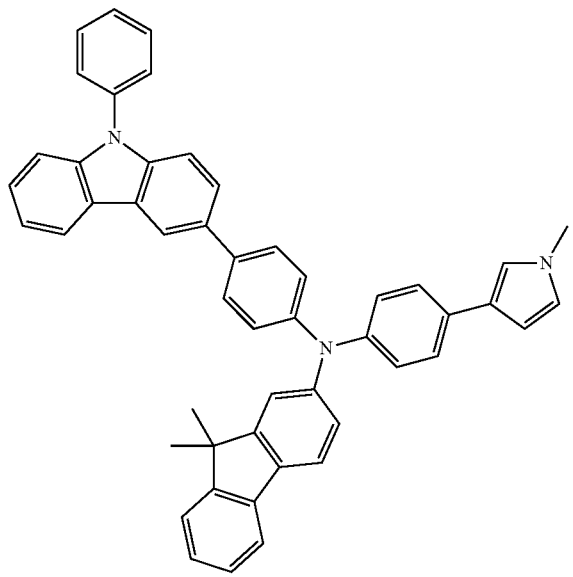

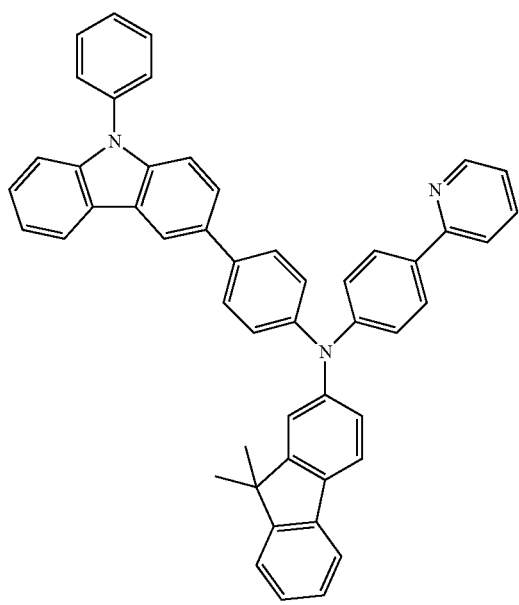

The first compound is a material with high mobility enabling good hole transport. The second compound is a material with better electron trapping ability than the first compound.

Since a layer which serves for hole transport may be degraded due to injected electrons, non-emissive quenching of excitons increases near an interface between the EML and the hole-related layers, and thus the luminous efficiency and lifetime of a diode may be decreased. Therefore, if a material capable of trapping electrons at the interface of the hole-related layers near the EML is used, non-emissive quenching may be reduced, and the lifetime of the diode may be improved. The highest occupied molecular orbital (HOMO) energy level of the second compound may be about 0.1 eV to about 0.2 eV lower than that of the first compound, and the lowest unoccupied molecular orbital (LUMO) energy level of the second compound may be about 0.1 eV to about 0.2 eV lower than that of the first compound. Due to such properties, the second compound may mitigate exciton quenching by trapping electrons in the first layer 142 and may improve the lifetime of the diode. Since the first layer 142 is closer to the EML 160 than the first charge generation layer 141, such effect may be obtained if the second compound (which has a LUMO energy level that is lower than that of the first compound) is used for the first layer 142. Likewise, since the second layer 144 is closer to the EML 160 than the second charge generation layer 143, the electron trapping ability and lifetime of the diode may be improved by using the fourth compound (which has a HOMO energy level and LUMO energy level lower than those of the third compound).

However, on one side, if the HOMO energy level and the LUMO energy level of the second compound is too much different from the HOMO energy level and the LUMO energy level of the first compound, driving voltage may be excessively increased.

For example, the HOMO energy level and the LUMO energy level of the first compound may be about $-4.7$ eV to about $-4.8$ eV and about $-0.9$ eV to about $-1.0$ eV respectively, and the HOMO energy level and the LUMO energy level of the second compound may be about $-4.8$ eV to about $-4.9$ eV and about $-1.0$ eV to about $-1.1$ eV respectively.

When the HOMO energy levels and the LUMO energy levels of the first compound and the second compound are within the ranges above, electrons may be trapped without an excessive increase in the driving voltage, and thus the injected electrons and energy may be readily transferred and the lifetime or the like of the diode may be improved.

The hole mobility of the first compound may be higher than the hole mobility of the second compound. As described above, since the first layer 142 is closer to the EML 160 than the first charge generation layer 141, non-emissive quenching may be inhibited by adding the second compound having a low hole mobility compared to the first layer 142. That is, the second compound included in the first layer 142 may have a lower hole mobility than that of the first compound included in the first charge generation layer 141. Likewise, since the second layer 144 is closer to the EML 160 than the second charge generation layer 143, non-emissive quenching may be inhibited by adding the fourth compound having a low hole mobility compared to the second layer 144.

The first charge generation material and the second charge generation material are included in the first charge generation layer 141 and the second charge generation layer 143 respectively. The first charge generation material and the second charge generation material generate charges in the first charge generation layer 141 and the second charge generation layer 143 respectively and form holes by strongly attracting electrons. Hole injection and transport toward the EML 160 from the first electrode 120 proceed easily, and the driving voltage of the OLED 100 may be decreased by forming holes.

The first charge generation material and the second charge generation material may each independently be, for example, a compound including at least one cyano group.

Nonlimiting examples of the first charge generation material and the second charge generation material include quinone derivatives such as tetracyanoquinodimethane (TCNQ), 2,3,5,6-tetrafluoro-tetracyano-1,4-benzoquinodimethane (F4-TCNQ), and the like.

The first charge generation material and the second charge generation material may each independently include at least one of Compounds 501 and 502.

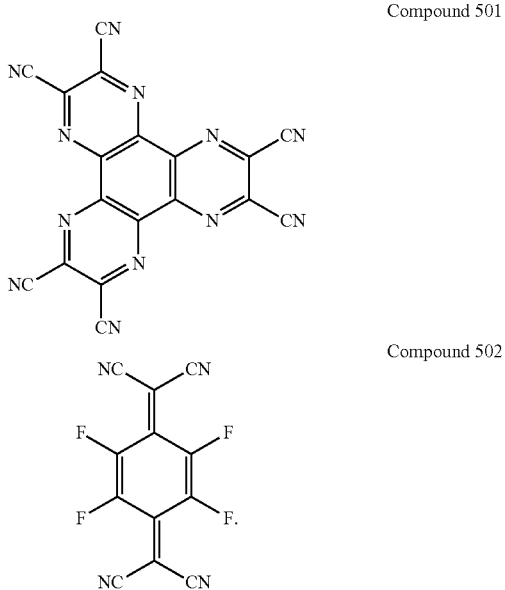

Compound 501

Compound 502

For example, the OLED 100 may have a structure including the substrate 110, the first electrode 120, the HIL 130, the fist charge generation layer 141 including the first compound and the first charge generation material, the first layer 142 including the second compound, the second charge generation layer 143 including the third compound and the second charge generation material, the second layer 144 including the fourth compound, the buffer layer 150, the EML 160, the ETL 170, the EIL 180, and the second electrode 190 (in sequential order).

In some embodiments, the first compound and the third compound may be identical to each other. If so, the first charge generation layer 141 and the second charge generation layer 143 may have similar properties in energy level or hole mobility.

Moreover, in some embodiments, the second compound and the fourth compound may be identical to each other. If so, the first layer 142 and the second layer 144 may have similar properties in energy level or hole mobility.

If the first compound and the third compound are identical to each other, and the second compound and the fourth compound are identical to each other, the first charge generation layer 141 and the second charge generation layer 143 may be formed of the same materials, and the first layer 142 and the second layer 144 may be formed of the same materials. If so, a multi-layered HTL may be used as the first charge generation layer 141 having two repeated units of the first layer 142. If the thicknesses of the first charge generation layer 141 and the second charge generation layer 143 are the same, and thicknesses of the first layer 142 and the second layer 144 are the same, the multi-layered HTL may be formed as units of the first charge generation layer 141 and the second charge generation layer 143 repeated exactly twice.

The thicknesses of the first layer 142 and the second layer 144 may each independently be from about 40 nm to about 60 nm. When the thicknesses of the first layer 142 and the second layer 144 are within the above range, hole mobility may be appropriately controlled without an excessive increase in driving voltage.

The concentration of the first charge generation material may be in a range of about 1 to about 3 parts by weight based on 100 parts by weight of the first charge generation layer 141. The first charge generation material may be modified in various ways, such as by being homogeneously or non-homogeneously dispersed. When the concentration of the first charge generation material is within the above range, an appropriate amount of charge may be generated in the first charge generation layer 141.

The concentration of the second charge generation material may be in a range of about 1 to about 3 parts by weight based on 100 parts by weight of the second charge generation layer 143. The second charge generation material may be modified in various ways, such as by being homogeneously or non-homogeneously dispersed. When the concentration of the second charge generation material is within the range above, an appropriate amount of charge may be generated in the second charge generation layer 141.

The thicknesses of the first charge generation layer 141 and the second charge generation layer 143 may each independently be in a range of about 10 nm to about 20 nm. When the thicknesses of the first charge generation layer 141 and the second charge generation layer 143 are within the above range, an appropriate amount of charge may be generated without an excessive increase in driving voltage.

The buffer layer 150 may be disposed between the EML 160 and the second layer 144. When the EML 160 and the second layer 144 are in contact with each other, the lifetime of the EML 160 may reduce since the second layer 144 may attract electrons. Therefore, lifetime may be improved by inserting the buffer layer 150 to prevent attracting electrons. Also, the buffer layer 150 may serve to increase efficiency by compensating the optical vibration distance according to the wavelength of light emitted from the EML 160. The buffer layer 150 may include a compound represented by Formula 1, which has high hole mobility or may include both the compound represented by Formula 1 and the first charge generation material.

The thickness of the buffer layer 150 may be in a range of about 0.1 to about 30 nm. When the thickness of the buffer layer 150 is within the above range, the efficiency of the OLED 100 may be improved due to compensation of the optical vibration distance according to the wavelength of light emitted from the EML 160 without an excessive increase in driving voltage.

The first layer 142 and the first charge generation layer 141 may be in contact with each other. When the first layer 142 and the first charge generation layer 141 are in contact with each other, charge balance may be improved.

The second layer 144 and the second charge generation layer 143 may be in contact with each other. When the second layer 144 and the second charge generation layer 143 are in contact with each other, charge balance may be improved.

In some embodiments, the OLED may include at least one of a hole blocking layer (HBL), ETL, EIL, and a functional layer having electron transport and electron injection abilities.

For example, the OLED may have a structure of "the first electrode/the first charge generation layer in which the first compound is doped with the first charge generation material/the first layer using the second compound/the second charge generation layer in which the third compound is doped with the second charge generation material/the second layer using the fourth compound/the buffer layer/EML/ETL/EIL/the second electrode," or a structure of "the first electrode/the first charge generation layer in which the first compound is doped with the first charge generation material/the first layer using the second compound/the second charge generation layer in which the first compound is doped with the first charge generation material/the second layer using the second compound/the buffer layer/EML/ETL/EIL/the second electrode."

Hereinafter, a structure and a manufacturing method of the OLED 100 will be described with reference to FIG. 1 according to an embodiment of the present invention.

For the substrate 110, any substrate commonly used for OLEDs may be used. For example, a glass substrate or a transparent plastic substrate having good mechanical strength, thermal stability, transparency, surface smoothness, ease of handling, and waterproofness may be used.

The first electrode 120 may be formed by applying a first electrode material on the substrate 120 using a method such as deposition or sputtering. When the first electrode 120 is an anode, the first electrode material may be selected from materials having a high work function in order to ease hole injection. The first electrode 120 may be a reflective electrode or a transparent electrode. Nonlimiting examples of the first electrode material include indium-tin oxide (ITO), indium-zinc oxide (IZO), tin oxide ($SnO_2$), and zinc oxide (ZnO) which are transparent and highly conductive. Also, when magnesium (Mg), aluminum (Al), aluminum-lithium (Al—Li), calcium (Ca), magnesium-indium (Mg—In), or magnesium-silver (Mg—Ag) is used as the first electrode material, the first electrode 120 may be formed as a reflective electrode. The first electrode 120 may include two materials that are different from each other. For, example, various modifications are possible, such as forming the first electrode 120 with a two layered-structure including two materials that are different from each other.

On the first electrode, the HIL 130 may be included. Depending on the desired purpose, the HIL 130 may be omitted.

The HIL 130 may be formed on the first electrode 120 using various methods, such as vacuum deposition, a wet process, or laser induced thermal imaging.

When the HIL 130 is formed using vacuum deposition, the deposition conditions may differ according to the compound used for the material of the HIL 130, the structure of the HIL 130 to be deposited, thermal properties, and the like. However, the deposition temperature may be selected within a range, for example, about 100° C. to about 500° C., a degree of vacuum may be selected within a range, for example, about $10^{-8}$ to about $10^{-3}$ torr, and a deposition speed may be selected within a range, for example, from about 0.01 Å/sec to about 100 Å/sec, but the deposition conditions are not limited thereto.

When the HIL 130 is formed using spin coating as a wet process, the coating conditions may differ according to the compound used for the material of the HIL 130, the structure of the HIL 130 to be coated, thermal properties, and the like. However, a deposition speed may be selected within a range from about 2000 rpm to about 5000 rpm, and a temperature for heat treatment (in order to remove solvent after coating) may be selected within a range from about 80° C. to about 200° C., but the coating conditions are not limited thereto.

For the HIL 130 material, a known hole injection material may be used, for example, a phthalocyanine compound such as copper phthalocyanine, m-MTDATA (refer to Formula below), TDATA (refer to Formula below), 2-TNATA (refer to Formula below), Polyaniline/Dodecylbenzenesulfonic acid (Pani/DBSA), Poly(3,4-ethylenedioxythiophene)/Poly(4-styrenesulfonate) (PEDOT/PSS), Polyaniline/Camphor sulfonicacid (Pani/CSA), or Polyaniline/Poly(4-styrenesulfonate) (Pani/PSS), but the hold injection material is not limited thereto.

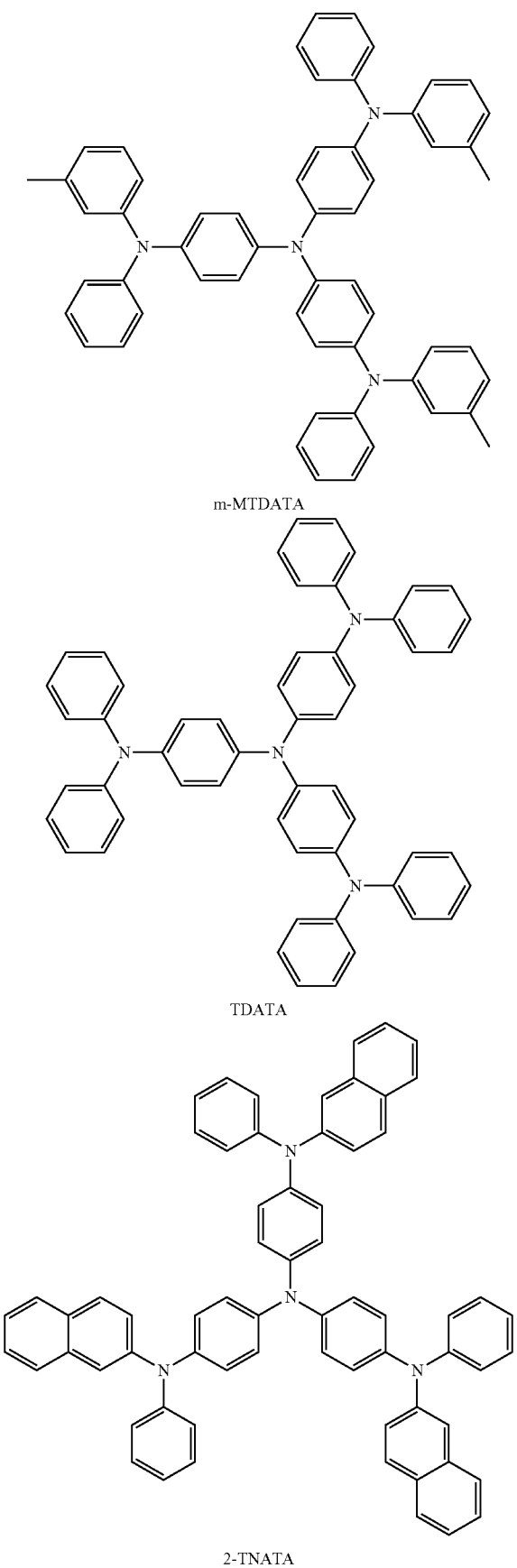

m-MTDATA

TDATA

2-TNATA

A thickness of the HIL 130 may be in a range of about 100 Å to about 10000 Å, for example, about 100 Å to about 1000 Å. When the thickness of the HIL 130 is within the ranges above, satisfactory hole injection properties may be obtained without a substantial increase in driving voltage.

Next, the HTL 140 may be formed on the HIL 130. The HTL 140 has a structure of the first charge generation layer 141, the first layer 142, the second charge generation layer 143, and the second layer 144 (in sequentially stacked order).

First, the first charge generation layer 141 may be formed on the HIL 130 using various methods, such as vacuum deposition, a wet process, or laser induced thermal imaging. When the first charge generation layer 141 is formed using a method such as vacuum deposition or spin coating, the deposition or coating conditions may differ according to the compound used, but the conditions may be generally selected from almost the same ranges described above for forming the HIL 130.

As a material of the first charge generation layer 141, the first compound doped with the first charge generation material may be used. The concentration of the first charge generation material may be in a range of about 1 to about 3 parts by weight based on 100 parts by weight of the first charge generation layer.

The thickness of the first charge generation layer 141 may be in a range of about 10 nm to about 20 nm. When the thickness of the first charge generation layer 141 is within the range above, a satisfactory hole transport property and appropriate amount of charge may be obtained without a substantial increase in driving voltage.

The first layer 142 may be formed on the first charge generation layer 141 using a method such as vacuum deposition, a wet process, or laser induced thermal imaging. When the first layer 142 is formed using vacuum deposition or spin coating, the deposition or coating conditions may differ according to the compound used, but the conditions may be generally selected from almost the same ranges as described above for forming the HIL 130.

The material for the first layer 142 may be the second compound.

The thickness of the first layer 142 may be in a range of about 40 nm to about 60 nm. When the thickness of the first layer 142 is within the range above, satisfactory hole transport properties and hole mobility may be obtained without a substantial increase in driving voltage.

The second charge generation layer 143 may be formed on the first layer 142 using a method such as vacuum deposition, a wet process, or laser induced thermal imaging. When the second charge generation layer 143 is formed using vacuum deposition or spin coating, the deposition or coating conditions may differ according to the compound used, but the conditions may be generally selected from almost the same ranges as described above for forming the HIL 130.

As the material of the second charge generation layer 143, the third compound doped with the second charge generation material may be used. The third compound and the first compound may be the same compound. Also, the second charge generation material and the first charge generation material may be the same materials.

The concentration of the second charge generation material may be in a range of about 1 to about 3 parts by weight based on 100 parts by weight of the second charge generation layer.

The thickness of the second charge generation layer 143 may be in a range of about 10 nm to about 20 nm. When the thickness of the second charge generation layer 143 is within the range above, satisfactory hole transport properties and an appropriate amount of charge may be obtained without a substantial increase in driving voltage.

The second layer 144 may be formed on the second charge generation layer 143 using a method such as vacuum deposition, a wet process, or laser induced thermal imaging. When the second layer 144 is formed using vacuum deposition or spin coating, the deposition or coating conditions may differ according to the compound used, but the conditions may be generally selected from almost the same ranges as described above for forming the HIL 130.

As the material of the second layer 144, the fourth compound may be used. The fourth compound and the second compound may be the same compound.

The thickness of the second layer 144 may be in a range of about 40 nm to about 60 nm. When the thickness of the second layer 144 is within the range above, satisfactory hole transport properties and hole mobility may be obtained without a substantial increase in driving voltage.

The buffer layer 150 may be formed on the second layer 144. When the buffer layer 150 is formed using vacuum deposition or spin coating, the deposition or coating conditions may differ according to the compound used, but the conditions may be generally selected from almost the same ranges as described above for forming the HIL 130.

As the material of the buffer layer 150, a compound represented by Formula 1 may be used.

The thickness of the buffer layer 150 may be in a range of about 0.1 nm to about 30 nm. When the thickness of the buffer layer 150 is within the range above, the efficiency of the OLED 100 may be improved due to compensation of the optical vibration distance according to the wavelength of light emitted from the EML 160 without an excessive increase in driving voltage.

The EML 160 may be formed on the buffer layer 150. When the EML 160 is formed using vacuum deposition or spin coating, the deposition or coating conditions may differ according to the compound used, but the conditions may be generally selected from almost the same ranges as described above for forming the HIL 130.

The EML 160 may include a known phosphorescent host, fluorescent host, phosphorescent dopant, or fluorescent dopant. As a known host, for example, 4,4'-N,N'-dicabazole-biphenyl (CBP), 9,10-di(naphthalene-2-yl)anthracene (ADN) (refer to Formula below), 1,3,5-tris(N-phenylbenzimidazole-2-yl)benzene (TPBI) (refer to Formula below), 3-tert-butyl-9,10-di(naphth-2-yl)anthracene (TBADN) (refer to Formula below), or E3 (refer to Formula below) may be used, but the host is not limited thereto.

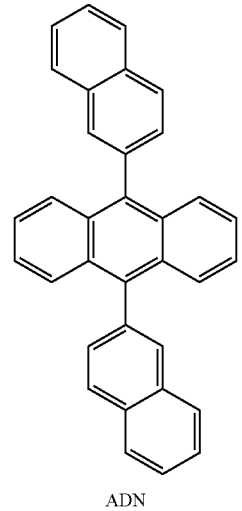

ADN

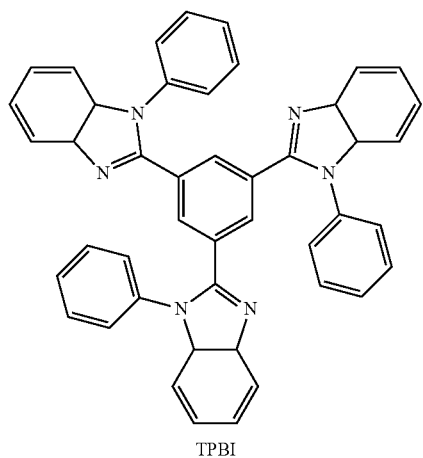

TPBI

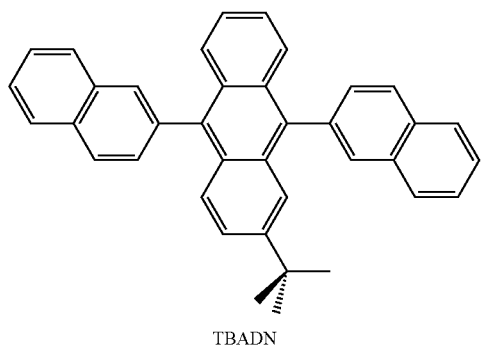

TBADN

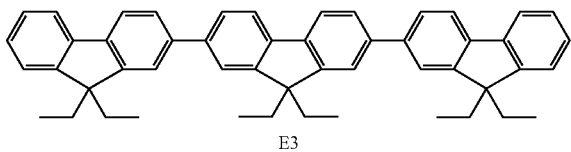

E3

Meanwhile, PtOEP (refer to Formula below), Ir(piq)₃ (refer to Formula below), or Btp₂Ir(acac) (refer to Formula below) may be used as a red dopant, but the red dopant is not limited thereto:

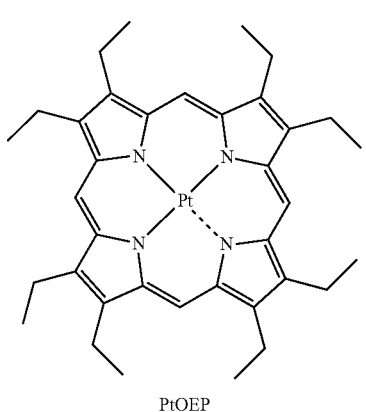

PtOEP

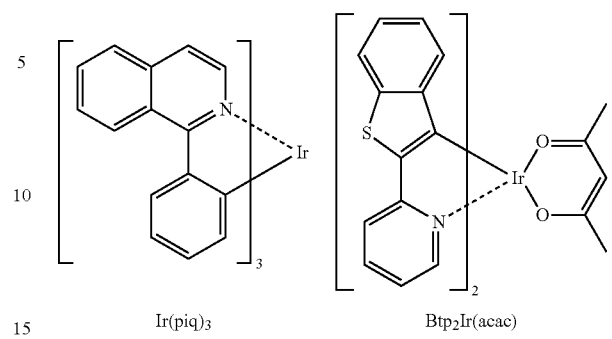

Ir(piq)₃          Btp₂Ir(acac)

Also, Ir(ppy)₃ (ppy=phenylpyridine, refer to Formula below), Ir(ppy)₂(acac) (refer to Formula below), or Ir(mpyp)₃ (refer to Formula below) may be used as a green dopant, but the green dopant is not limited thereto:

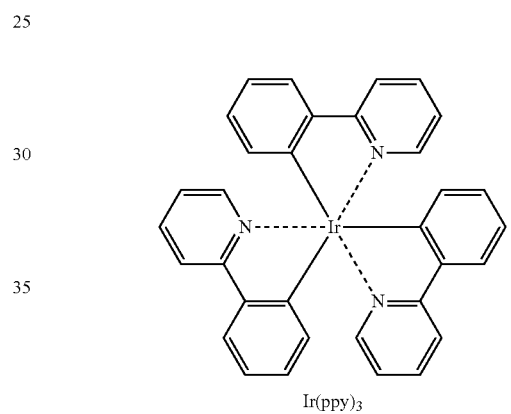

Ir(ppy)₃

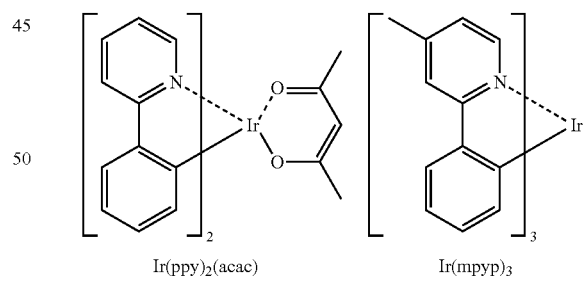

Ir(ppy)₂(acac)          Ir(mpyp)₃

F₂Irpic (refer to Formula below), (F₂ppy)₂Ir(tmd) (refer to Formula below), Ir(dfppz)₃ (refer to Formula below), DPVBi (refer to Formula below), 4,4'-bis(4-diphenylaminostyryl)biphenyl, (DPAVBi refer to Formula below), 2,5,8,11-tetra-tert-butyl perylene (TBPe, refer to Formula below) may be used as a blue dopant, but the blue dopant is not limited thereto:

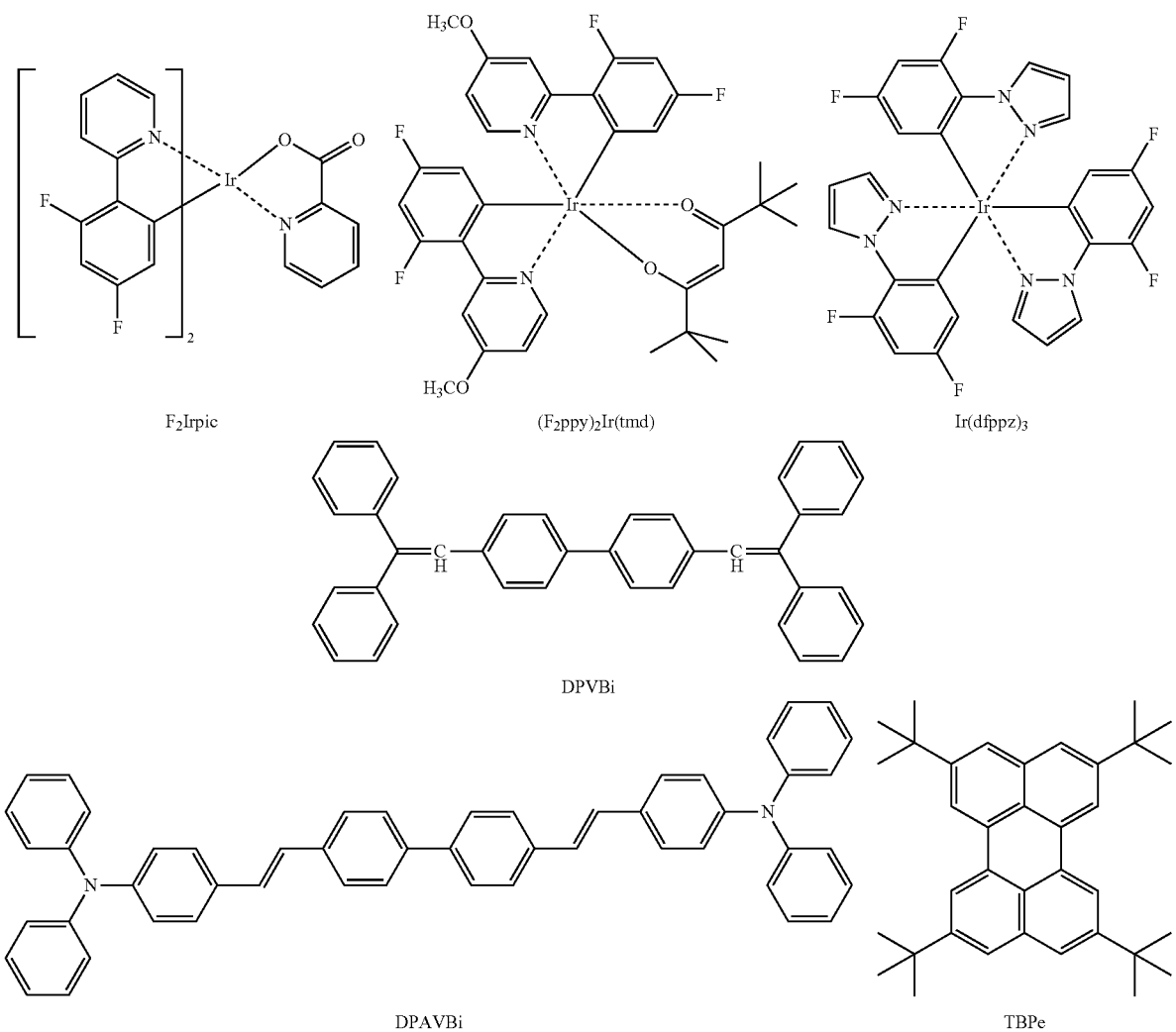

When the EML 160 includes a host or dopant, the concentration of the dopant may be generally selected from a range of about 0.01 parts by weight to about 15 parts by weight based on 100 parts by weight of the host, but the concentration is not limited thereto.

The thickness of the EML 160 may be in a range of about 100 Å to about 1000 Å, for example, about 200 Å to about 600 Å. When the thickness of the EML 160 is within the ranges above, good light-emitting properties may be obtained without a substantial increase in driving voltage.

When a phosphorescent dopant is included in the EML 160, an HBL (not shown in FIG. 1) may be formed between the HTL 170 and the EML 160 using vacuum deposition, a wet process, or laser induced thermal imaging in order to prevent triplet excitons or holes from being dispersed into the ETL 170. When the HBL is formed using vacuum deposition or spin coating, the deposition or coating conditions may differ according to the compound used, but the conditions may be generally selected from almost the same ranges as described above for forming the HIL 130. A known hole blocking material may be used, and nonlimiting examples of known hole blocking materials include derivatives of oxadiazole, derivatives of triazole, and derivatives of phenanthroline.

The thickness of the HBL may be in a range of about 50 Å to about 1000 Å, for example, about 100 Å to about 300 Å. When the thickness of the HBL is within the range above, good hole blocking properties may be obtained without a substantial increase in driving voltage.

Next, the ETL 170 is formed using various methods such as vacuum deposition, a wet process, or laser induced thermal imaging. The ETL may be a known electron transport material. Examples of the known electron transport material include derivatives of quinoline, especially tris(8-quinolinolate)aluminum ($Alq_3$), TAZ (refer to Formula below), BAlq (refer to Formula below), or beryllium bis(benzoquinolin-10-olate) ($Bebq_2$), but are not limited thereto.

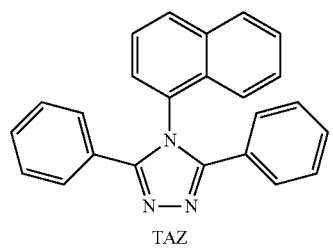

TAZ

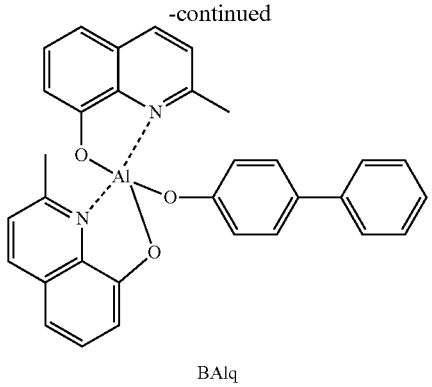

BAlq

The ETL 170 may include an electron transporting organic compound below. Examples of the electron transporting organic compound may be an anthracene-based compound such as 9,10-di(naphthalene-2-yl)anthracene (ADN); and Compounds 601 and 602 below, but the electron transporting organic compound is not limited thereto.

Compound 601

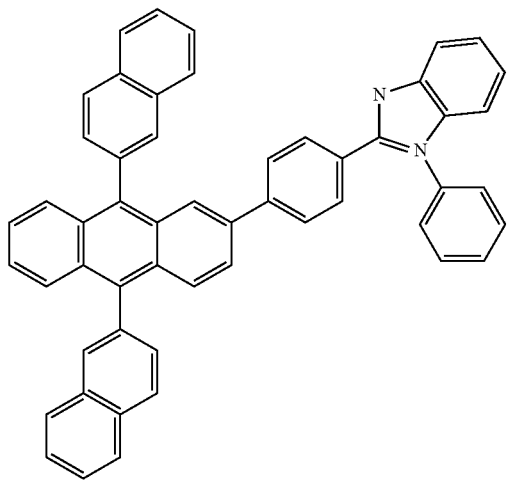

Compound 602

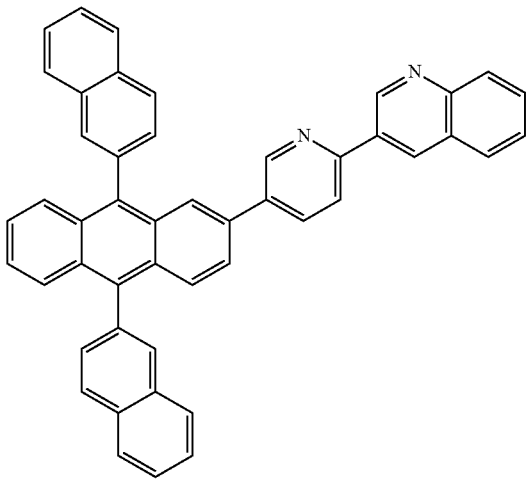

The thickness of the ETL 170 may be in a range of about 100 Å to about 1000 Å, for example, about 150 Å to about 500 Å. When the thickness of the ETL 170 is within the range above, satisfactory electron transport properties may be obtained without a substantial increase in driving voltage. When the ETL 170 is formed using vacuum deposition or spin coating, the deposition or coating conditions may differ according to the compound used, but the conditions may be generally selected from almost the same ranges as described above for forming the HIL 130.

The EIL 180 (which enables easy injection of electrons from the anode) may be disposed on the ETL 170. The material forming the EIL 180 may be an EIL forming material and may be any known material such as LiF, NaCl, CsF, $Li_2O$, BaO, or LiQ. The deposition conditions for the EIL 180 may differ according to the compound used, but the conditions may be generally selected from almost the same ranges as described above for forming the HIL 130.

The thickness of the EIL 180 may be in a range of about 1 Å to about 100 Å, for example, about 3 Å to about 90 Å. When the thickness of the EIL 180 is within the ranges above, satisfactory electron injection properties may be obtained without a substantial increase in driving voltage.

On the EIL 180, the second electrode 190, which is a transparent electrode, is disposed. The second electrode 190 may be a cathode, which is an electron injection electrode, and a metal for forming the second electrode 190 may include a metal having a low work function, such as a metal, an alloy, an electrically conductive compound, and a mixture thereof. In particular, the second electrode 190 may be formed as a thin film using lithium (Li), magnesium (Mg), aluminum (Al), aluminum-lithium (Al—Li), calcium (Ca), magnesium-indium (Mg—In), or magnesium-silver (Mg—Ag), thus being transparent. In order to obtain a top-emission type OLED, the second electrode 17 may be formed as a transparent electrode using ITO or IZO.

As described above, the OLED is described with reference to FIG. 1, but is not limited thereto.

Figure 2:
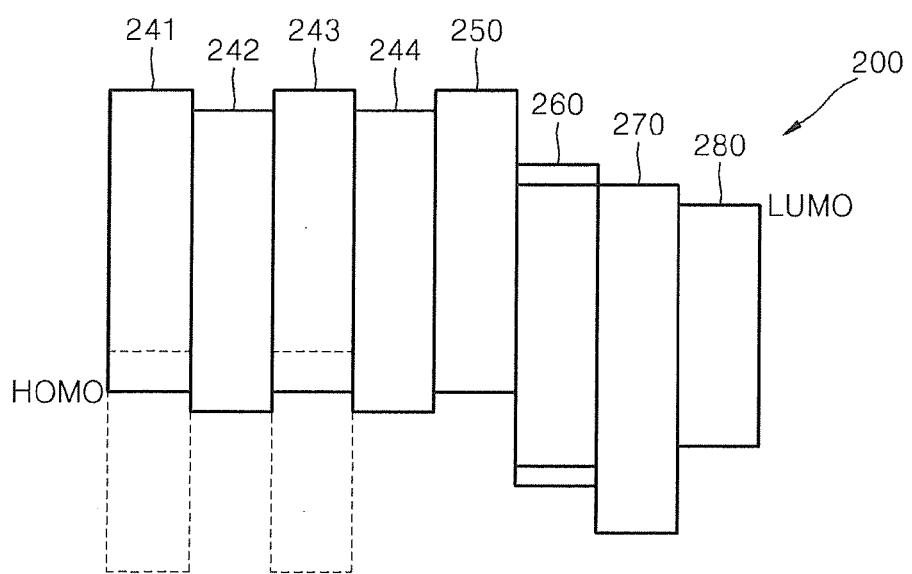
FIG. 2 shows the energy levels of an OLED according to an embodiment.

FIG. 2 illustrates the energy levels of an OLED 200 according to an embodiment.

The OLED 200 includes a first charge generation layer 241, a first layer 242, a second charge generation layer 243, a second layer 244, a buffer layer 250, an EML 260, an ETL 270, and an EIL 280.

The first charge generation layer 241 includes a first compound and a first charge generation material, and the second charge generation layer 243 includes a third compound and a second charge generation material. Both layers have similar HOMO and LUMO energy levels to each other. The first layer 242 includes the second compound, and the second layer 244 includes the fourth compound. Both layers have similar HOMO and LUMO energy levels to each other.

The first charge generation layer 241 and the second charge generation layer 243 include the first charge generation material and the second charge generation material, respectively, and their HOMO and LUMO energy levels are shown with dotted lines.

The HOMO and LUMO energy levels of the second compound included in the first layer 242 are about 0.1 eV lower than the HOMO and LUMO energy levels of the first compound in the first charge generation layer 241. The HOMO and LUMO energy levels of the fourth compound included in the second layer 244 are also about 0.1 eV lower than the HOMO and LUMO energy levels of the third compound in the second charge generation layer 243. The HOMO and LUMO energy levels of the first charge generation material and the second charge generation material are relatively low.

Therefore, the first charge generation layer 241 and the second charge generation layer 243 may inhibit a decrease in driving voltage.

The OLED may be included in a flat display device including a transistor. The flat display device including the transistor includes a source, drain, gate and an active layer, and the OLED includes a multi-layered HTL. The first electrode of the OLED is electrically connected to one of the source and the drain.

The active layer of the transistor may be an amorphous silicon layer, a crystalline silicon layer, an organic semiconductor layer, or an oxide semiconductor layer.

Hereinafter, an OLED according to embodiments of the present invention will be described in more detail with reference to the following examples. However, these examples are presented for illustrative purposes only and are not intended to limit the scope of the invention.

EXAMPLE 1

A 15 $\Omega/cm^2$ (1200 Å) ITO glass substrate (manufactured by Corning) as an anode was cut into a size of 50 mm×50 mm×0.7 mm, ultrasonically cleansed using isopropyl alcohol and pure water for 5 minutes each, irradiated with a UV ray for 30 minutes, cleansed by being exposed to ozone, and the ITO glass substrate was placed on a vacuum deposition device.

A first charge generation layer with a thickness of about 100 Å was formed by vacuum co-depositing Compound 301 and Compound 501 in a ratio of 98:2 by weight on the ITO glass substrate. A first layer with a thickness of about 400 Å was formed by vacuum depositing Compound 35 on the first charge generation layer. A second charge generation layer with a thickness of about 200 Å was formed by vacuum co-depositing Compound 301 and Compound 501 in a ratio of 98:2 by weight on the first layer. A second layer with a thickness of about 400 Å was formed by vacuum depositing Compound 35 on the second charge generation layer.

A buffer layer with a thickness of about 230 Å was formed by vacuum co-depositing Compound 301 and Compound 501 in a ratio of 98:2 by weight on the second layer.

An EML with a thickness of about 200 Å was formed by vacuum co-depositing ADN and DPVBi in a ratio of 98:2 by weight on the buffer layer. Subsequently, an ETL with a thickness of about 300 Å was formed by vacuum depositing $Alq_3$ on the EML.

An EIL with a thickness of about 10 Å was formed by vacuum depositing a halogenated alkali metal, LiF, on the ETL, and Al was vacuum deposited with a thickness of about 3000 Å (cathode). Therefore, a LiF/Al electrode was formed, and thus an OLED was manufactured.

EXAMPLE 2

An OLED was manufactured in the same manner as in Example 1, except that Compound 2 was used for vacuum deposition instead of Compound 35 during formation of each of the first layer and the second layer.

EXAMPLE 3

An OLED was manufactured in the same manner as in Example 1, except that Compound 14 was used for vacuum deposition instead of Compound 35 during formation of the second layer.

COMPARATIVE EXAMPLE 1

An OLED was manufactured in the same manner as in Example 1, except that an HTL with a thickness of about 600 Å was formed by vacuum depositing 2-TNATA on the ITO glass substrate instead of forming the first charge generation layer, the first layer, the second charge generation layer, and the second layer on the ITO glass substrate.

COMPARATIVE EXAMPLE 2

An OLED was manufactured in the same manner as in Example 1, except that the second charge generation layer and the second layer were not formed.

COMPARATIVE EXAMPLE 3

An OLED was manufactured in the same manner as in Example 1, except that a first layer with a thickness of 100 Å was formed by vacuum co-depositing Compound 301 and Compound 501 in a ratio of 98:2 by weight on the ITO glass substrate, a second layer with a thickness of 400 Å was formed by vacuum depositing Compound 301 on the first layer, a third layer with a thickness of 200 Å was formed by vacuum co-depositing Compound 35 and Compound 501 in a ratio of 98:2 by weight on the second layer, and a fourth layer with a thickness of 400 Å was formed by vacuum depositing Compound 35 on the third layer.

EVALUATION EXAMPLE

Driving voltage, Commission Internationale d'Eclairage (CIE) y value of chromaticity, luminous efficiency, and lifetime of each of the OLEDs manufactured according to Examples 1 through 3 and Comparative Examples 1 through 3 were measured using a PR650 Spectroscan Source Measurement Unit (manufactured by PhotoResearch), and the measurement results are shown in Table 1 below.

TABLE 1

| Section | HTL | Driving voltage (V) | Current density (mA/cm$^2$) | CIE_y | Efficiency/y |
|---|---|---|---|---|---|
| Example1 | Compound 301: Compound 501/ Compound 35/ Compound 301: Compound 501/ Compound35/ a buffer layer | 4.3 | 12.8 | 0.032 | 101.3 |
| Example2 | Compound 301: Compound 501/ Compound 2/ Compound 301: Compound 501/ Compound 2/ a buffer layer | 4.3 | 13.8 | 0.038 | 93.6 |
| Example3 | Compound 301: Compound 501/ Compound 35/ Compound 301: Compound 501/ Compound 14/ a buffer layer | 4.1 | 14.3 | 0.043 | 91.4 |
| Comparative Example1 | 2-TNATA | 4.9 | 19.2 | 0.055 | 69.4 |
| Comparative Example2 | Compound 301: Compound 501/ Compound 35/ a buffer layer | 5.0 | 17.1 | 0.067 | 78.0 |

TABLE 1-continued

| Section | HTL | Driving voltage (V) | Current density (mA/cm$^2$) | CIE_y | Efficiency/y |
|---|---|---|---|---|---|
| Comparative Example3 | Compound 301: Compound 501/ Compound 301/ Compound 35: Compound 501/ Compound 35/ a buffer layer | 5.3 | 17.5 | 0.031 | 78.0 |

As shown in Table 1, the OLEDs according to embodiments of the present invention (Examples 1 through 3) have decreased driving voltages and improved efficiencies compared to the OLEDs of Comparative Examples 1 through 3. Particularly, the OLEDs according to embodiments of the present invention (Examples 1 through 3) have about 20% increased luminous efficiency compared to the OLEDs of Comparatvie Examples 1 through 3.

Figure 3:
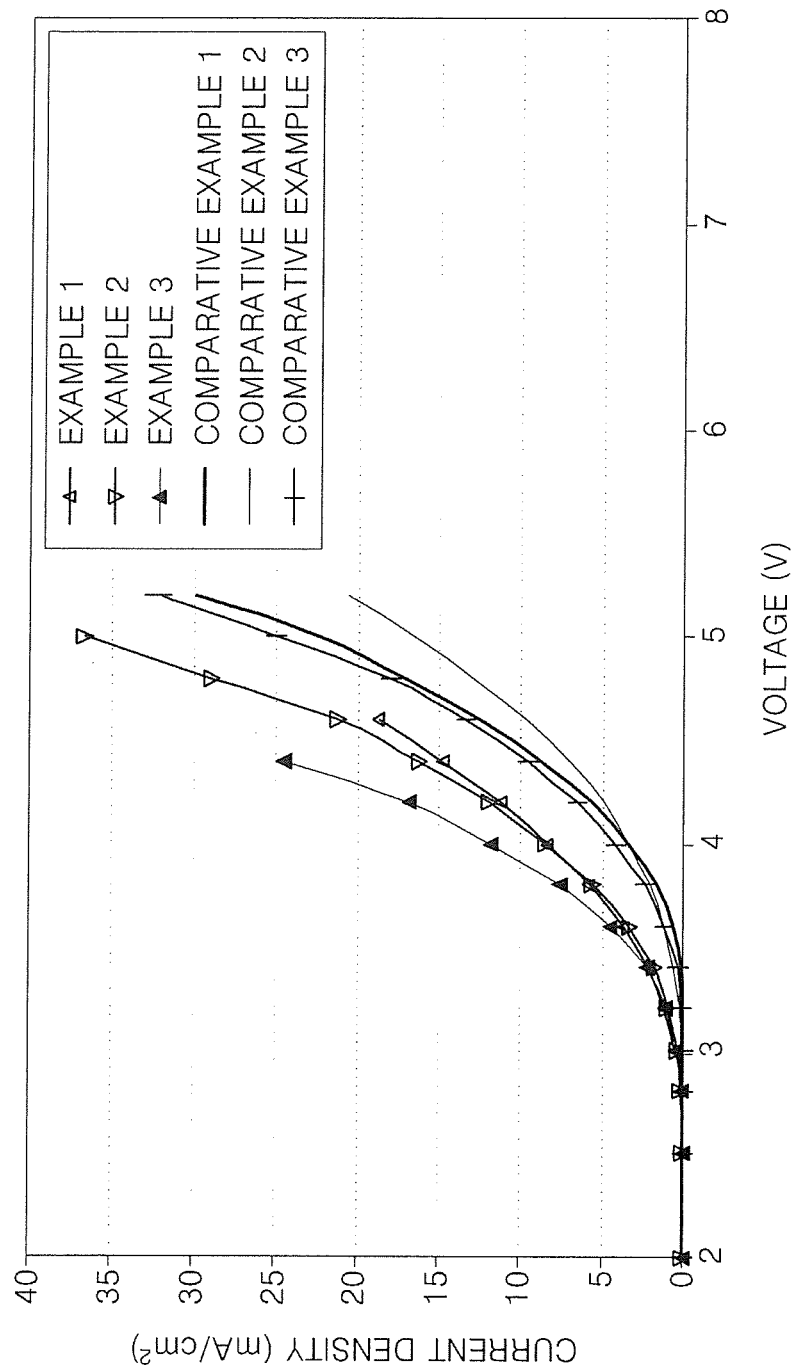
FIG. 3 is a graph of driving voltage versus current density of the OLEDs manufactured according to Examples 1 to 3 and Comparative Examples 1 to 3.

FIG. 3 is a graph of the relationship between driving voltage and current density of the OLEDs of Examples 1 through 3 and Comparative Examples 1 through 3. Referring to FIG. 3, the OLEDs according to embodiments of the present invention (Examples 1 through 3) have decreased driving voltages compared to the OLEDs of Comparatvie Examples 1 through 3.

Figure 4:
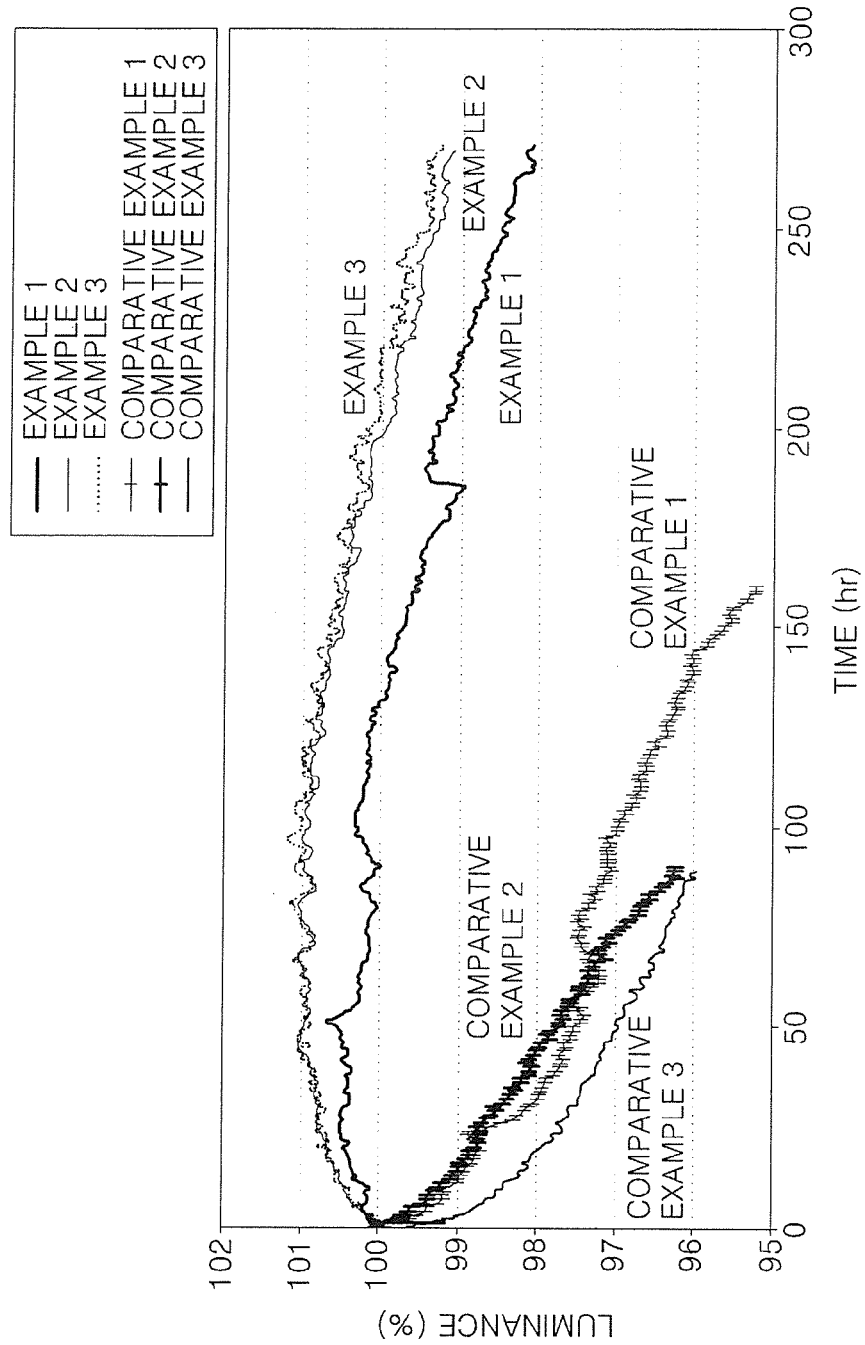
FIG. 4 is a graph of the lifetime characteristics of the OLEDs manufactured according to Examples 1 to 3 and Comparative Examples 1 to 3.

FIG. 4 is a graph of lifetime characteristics of the OLEDs of Examples 1 through 3 and Comparative Examples 1 through 3. Referring to FIG. 4, the OLEDs according to embodiments of the present invention (Examples 1 through 3) have about three times the lifetime of the OLEDs of Comparatvie Examples 1 through 3.

The OLEDs according to embodiments of the present invention have improved charge balance, improved diode stability, high luminous efficiency, and long lifetimes.

The OLEDs according to embodiments of the present invention have long lifetimes of blue emitting diodes while maintaining emitting diode characteristics of green and red emitting diodes consistent with conventional levels.

While the present invention has been illustrated and described with reference to exemplary embodiments, it will be understood by those of ordinary skill in the art that various changes in form and details may be made to the described embodiments without departing from the spirit and scope of the present invention as defined by the following claims.

What is claimed is:

1. An organic light-emitting diode (OLED) comprising:
a first electrode;
a second electrode facing the first electrode;
an emission layer (EML) between the first electrode and the second electrode;
a first charge generation layer between the EML and the first electrode, the first charge generation layer comprising a first compound and a first charge generation material;
a first layer between the EML and the first charge generation layer, the first layer comprising a second compound;
a second charge generation layer between the EML and the first layer, the second charge generation layer comprising a third compound and a second charge generation material;
a second layer between the EML and the second charge generation layer, the second layer comprising a fourth compound; and
a buffer layer between the EML and the second layer,
wherein each of the first compound and the third compound independently comprises a compound represented by Formula 1, and each of the second compound and the fourth compound independently comprises a compound represented by Formula 2:

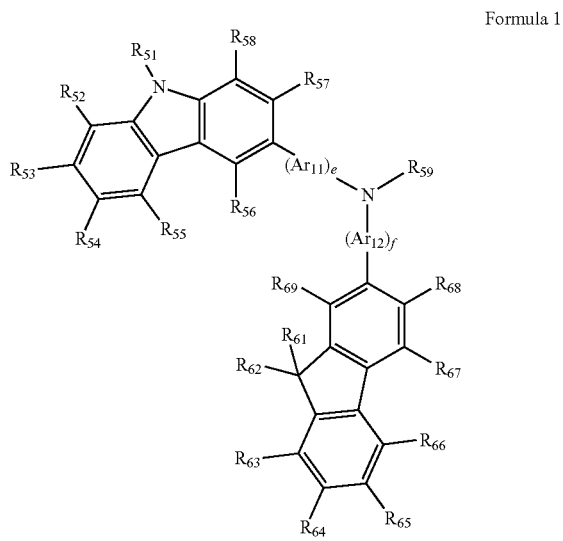

Formula 1 wherein, each of $Ar_{11}$ and $Ar_{12}$ independently comprises a substituted or unsubstituted $C_5$-$C_{60}$ arylene group;
each of e and f is independently an integer of 0 to 5;
each of $R_{51}$ through $R_{58}$ and $R_{61}$ through $R_{69}$ independently comprises a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, or a substituted or unsubstituted $C_5$-$C_{60}$ arylthio group;
$R_{59}$ comprises a phenyl group, a naphthyl group, an anthryl group, a biphenyl group, or a pyridyl group; or a phenyl group, a naphthyl group, an anthryl group, a biphenyl group, or a pyridyl group, in which at least one hydrogen atom is substituted with at least one of a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{20}$ alkyl group, and a substituted or unsubstituted $C_1$-$C_{20}$ alkoxy group, Formula 2

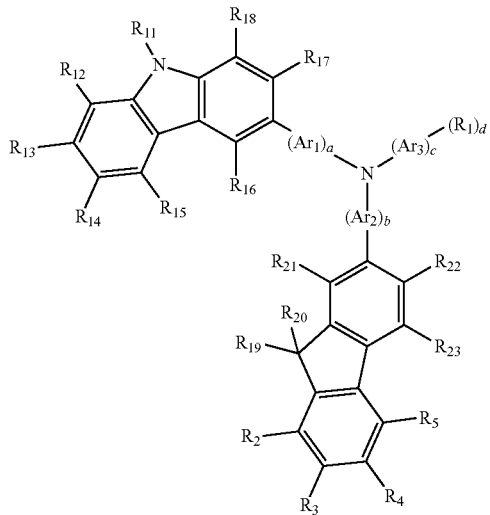

wherein, each of Ar₁ through Ar₃ independently comprises a substituted or unsubstituted $C_5$-$C_{60}$ arylene group;
each of a and b is independently an integer of 0 to 5;
c is an integer of 1 to 5
each of $R_1$ through $R_5$ independently comprises one of a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{31}$)($R_{32}$)($R_{33}$), —N($R_{34}$)($R_{35}$), or a nitrogen atom-containing group, wherein at least one of $R_1$ through $R_5$ is a nitrogen atom-containing group;
d is an integer of 0 to 5;
each of $R_{11}$ through $R_{23}$ independently comprises a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, —Si($R_{36}$)($R_{37}$)($R_{38}$), or —N($R_{39}$)($R_{40}$);
each of $R_{31}$ through $R_{40}$ independently comprises a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, or a substituted or unsubstituted $C_2$-$C_{60}$ heteroaryl group; and
the nitrogen atom-containing group comprises a 5-membered aromatic ring, a 6-membered aromatic ring, or a 9-membered aromatic ring in which a 5-membered aromatic group and a 6-membered aromatic group are fused.

2. The OLED of claim 1, wherein a highest occupied molecular orbital (HOMO) energy level of the second compound is about 0.1 eV to about 0.2 eV lower than a HOMO energy level of the first compound, and a lowest unoccupied molecular orbital (LUMO) energy level of the second compound is about 0.1 eV to about 0.2 eV lower than a LUMO of the first compound.

3. The OLED of claim 1, wherein a hole mobility of the first compound is higher than a hole mobility of the second compound.

4. The OLED of claim 1, wherein the first compound and the third compound each independently comprises a compound represented by Formula 1A below:

Formula 1A

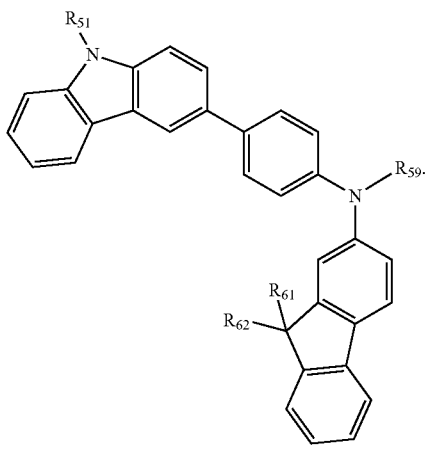

5. The OLED of claim 1, wherein the first compound and the third compound each independently comprises Compound 301 below:

Compound 301

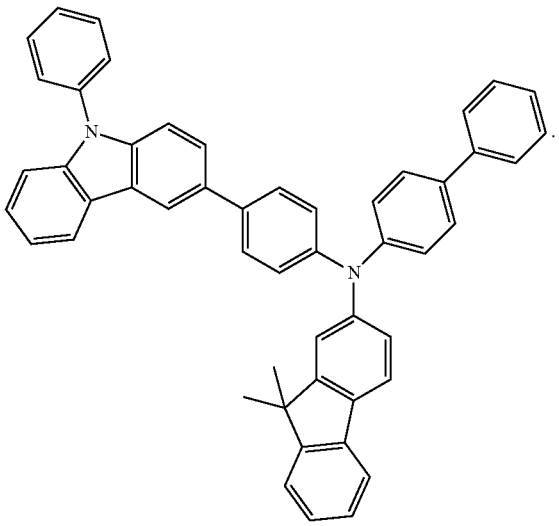

6. The OLED of claim 1, wherein the second compound and the fourth compound each independently comprises a compound represented by Formulae 2A through 2K below:
Formula 2A
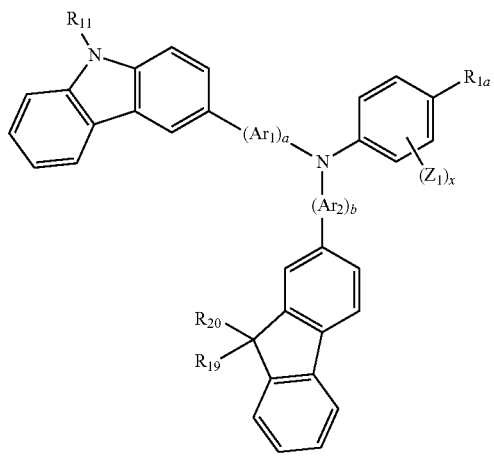
Formula 2B
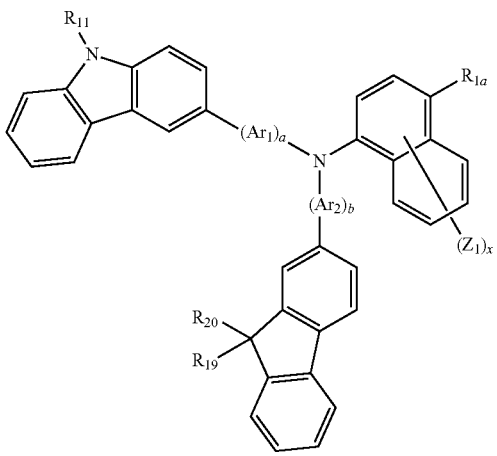
Formula 2C
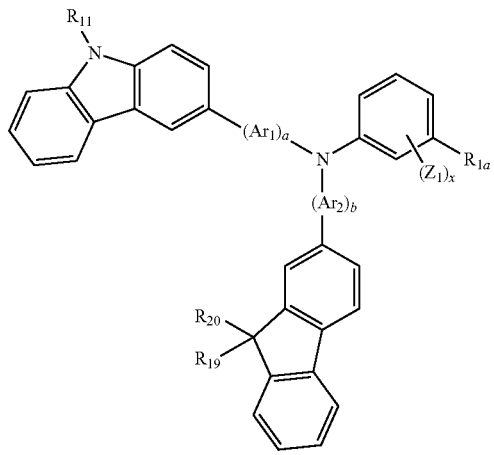
-continued
Formula 2D
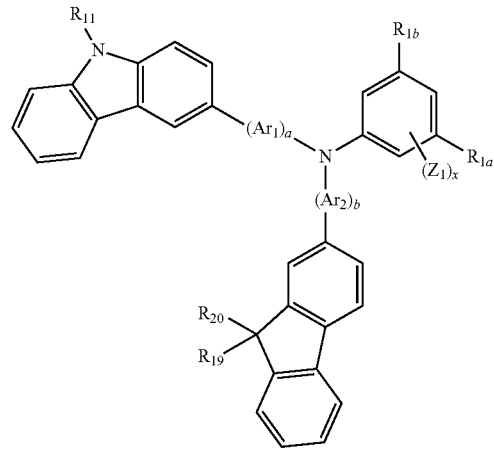
Formula 2E
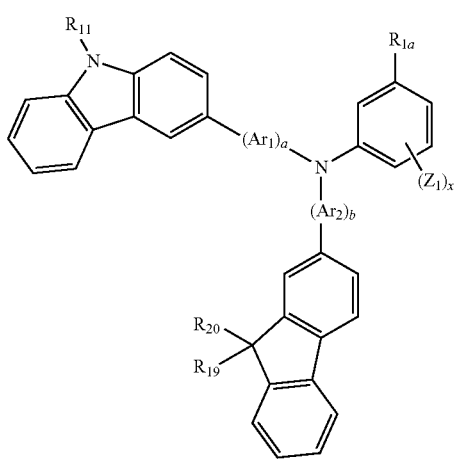
Formula 2F
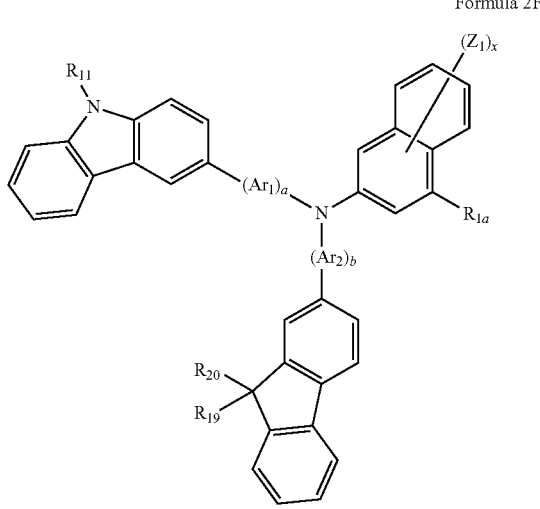

-continued

Formula 2G

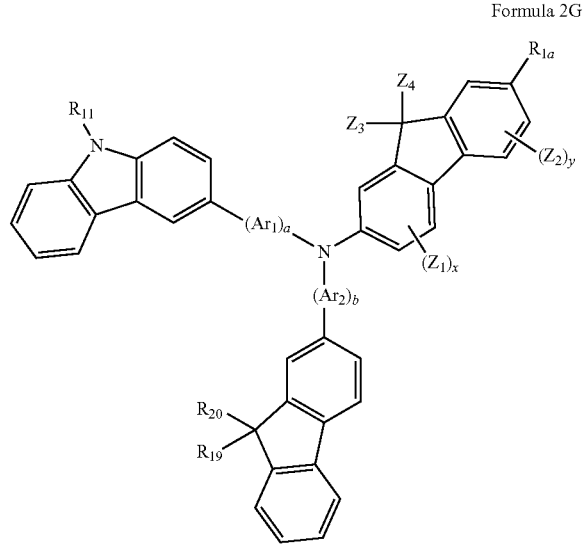

Formula 2H

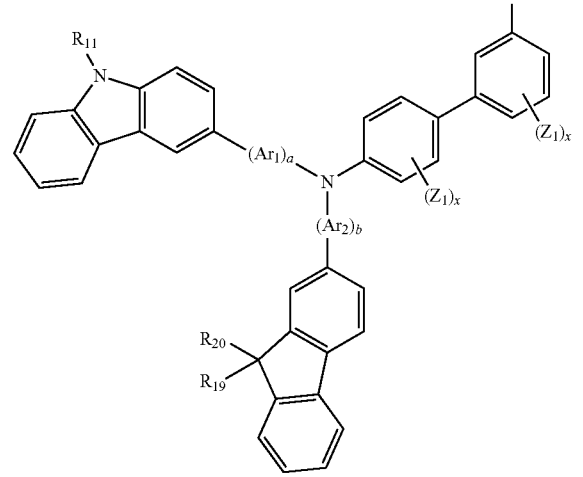

Formula 2I

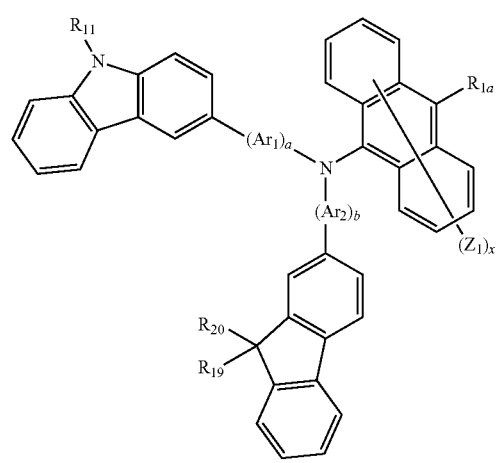

Formula 2J

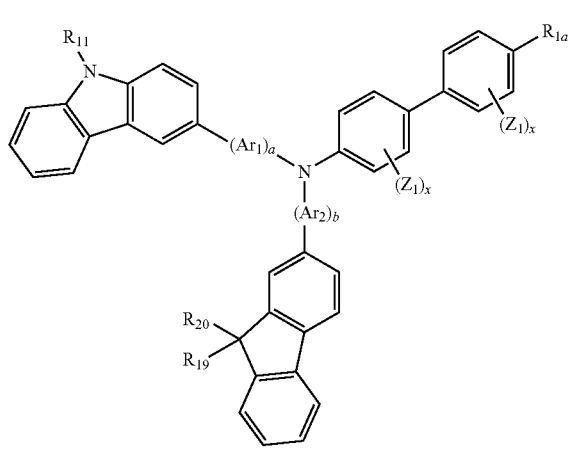

Formula 2K

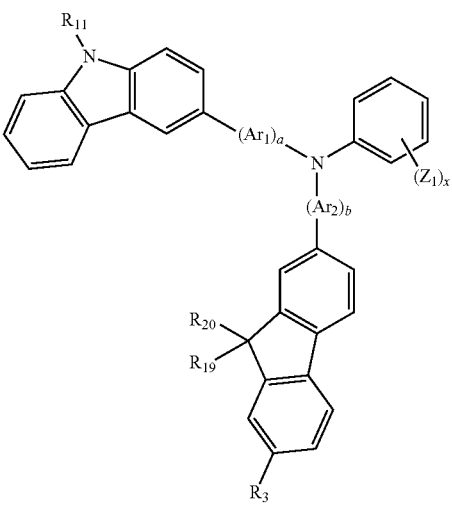

wherein each of $Ar_1$ and $Ar_2$ independently comprises a substituted or unsubstituted $C_5$-$C_{60}$ arylene group;

each of a and b is independently an integer of 0 to 5;

each of $R_{1a}$, $R_{1b}$ and $R_3$ independently comprises a nitrogen atom-containing group;

each of $R_{11}$, $R_{19}$ and $R_{20}$ independently comprises a substituted or unsubstituted $C_1$-$C_{60}$ alkyl group or a substituted or unsubstituted $C_5$-$C_{60}$ aryl group;

each of $Z_1$ through $Z_4$ independently comprises a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{50}$ arylthio group, —Si($Q_1$)($Q_2$)($Q_3$) or —N($Q_4$)($Q_5$), wherein when x or y is 2 or greater, a plurality of $Z_1$ or $Z_2$ may be identical to or different from each other;

each of $Q_1$ through $Q_5$ independently comprises a hydrogen atom, a deuterium atom, a halogen atom, a hydroxyl group, a cyano group, a nitro group, an amino group, an amidino group, hydrazine, hydrazone, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_5$-$C_{60}$ aryl group, a substituted or unsubstituted $C_5$-$C_{60}$ aryloxy group, a substituted or unsubstituted $C_5$-$C_{60}$ arylthio group, or a substituted or unsubstituted $C_2$-$C_{60}$ heteroaryl group;

x is an integer of 1 to 8; and y is an integer of 1 to 3.

7. The OLED of claim 1, wherein the second compound and the fourth compound each independently comprise one of Compounds 2, 8, 14, 15, 16, 20, 31 and 35:

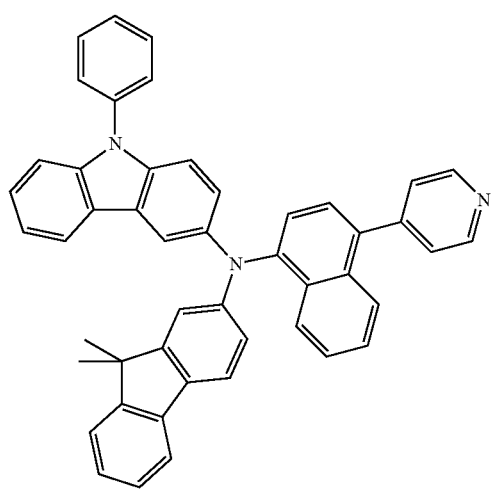

2

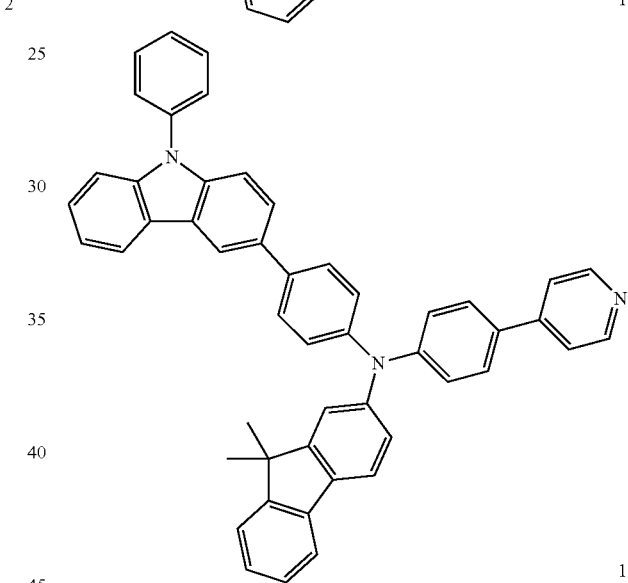

14

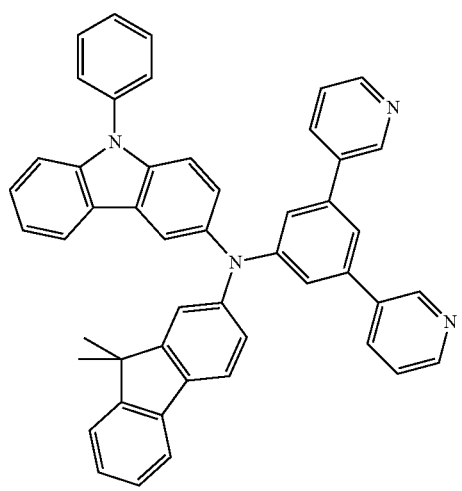

8

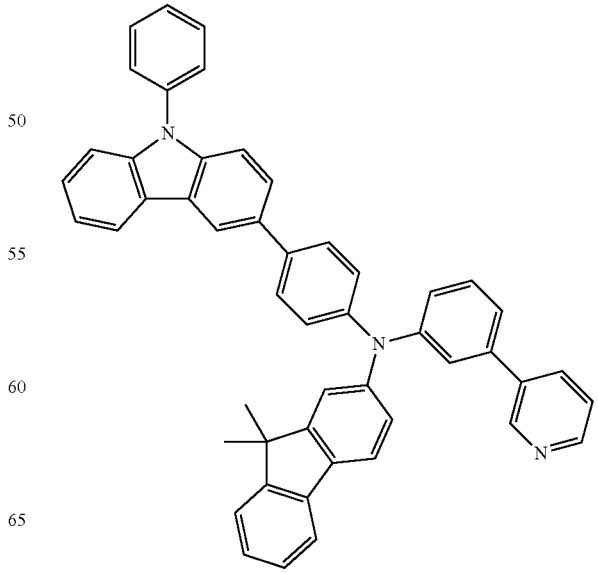

15

16

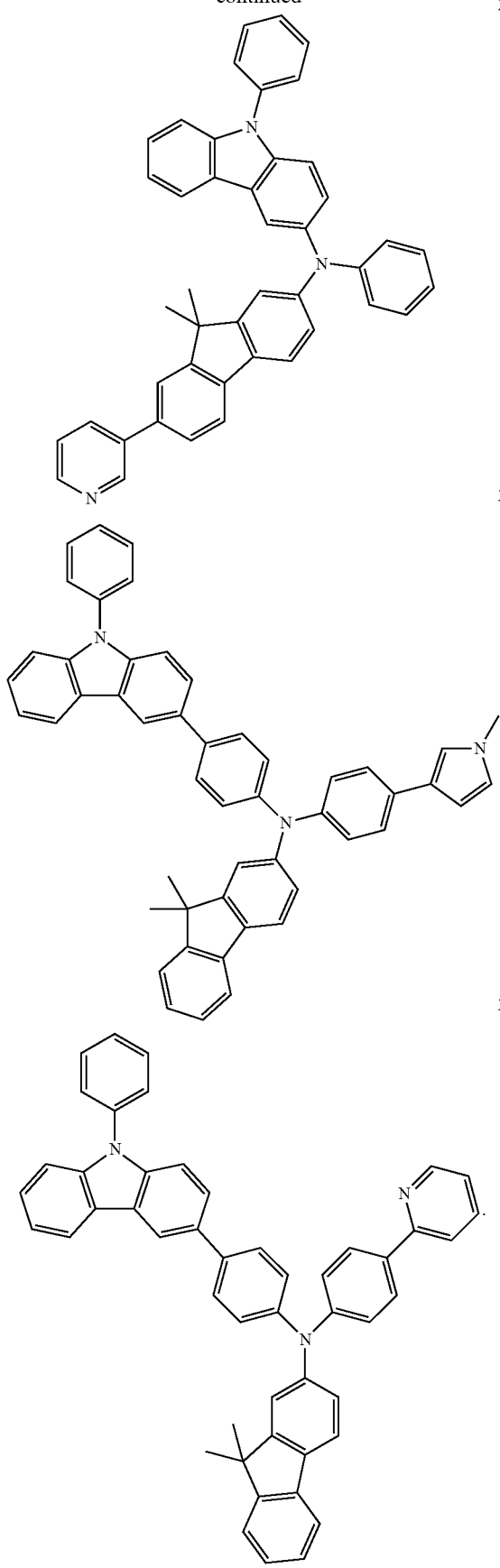

8. The OLED of claim 1, wherein the first charge generation material and the second charge generation material each independently comprises one of Compounds 501 and 502:

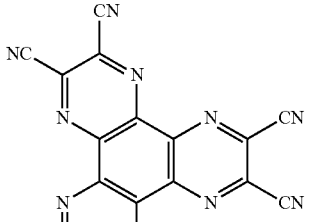

Compound 501

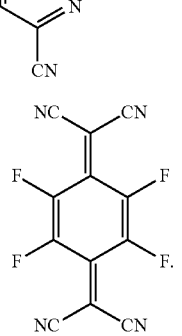

Compound 502

9. The OLED of claim 1, wherein the first compound and the third compound are the same compound.

10. The OLED of claim 1, wherein the second compound and the fourth compound are the same compound.

11. The OLED of claim 1, wherein thicknesses of the first layer and the second layer are each independently in a range of about 40 nm to about 60 nm.

12. The OLED of claim 1, wherein a concentration of the first charge generation material is in a range of about 1 to about 3 parts by weight based on 100 parts by weight of the first charge generation layer.

13. The OLED of claim 1, wherein a concentration of the second charge generation material is in a range of about 1 to about 3 parts by weight based on 100 parts by weight of the second charge generation layer.

14. The OLED of claim 1, wherein thicknesses of the first charge generation layer and the second charge generation layer are each independently in a range of about 10 nm to about 20 nm.

15. The OLED of claim 1, wherein the buffer layer comprises a compound represented by Formula 1.

16. The OLED of claim 1, wherein a thickness of the buffer layer is in a range of about 0.1 nm to about 30 nm.

17. The OLED of claim 1, wherein the first layer and the first charge generation layer are in contact with each other.

18. The OLED of claim 1, wherein the second layer and the second charge generation layer are in contact with each other.

19. The OLED of claim 1, wherein the OLED comprises at least one additional layer between the EML and the second electrode, the at least one additional layer comprising a hole blocking layer, an electron transport layer, an electron injection layer, a functional layer having electron transport and electron injection ability, or a combination thereof.

20. A flat display device, comprising a transistor comprising a source, a drain, a gate, an active layer, and the OLED of claim 1, wherein the first electrode of the OLED is electrically connected to the source or the drain.

* * * * *